(12) United States Patent
Li et al.

(10) Patent No.: US 9,406,875 B2
(45) Date of Patent: Aug. 2, 2016

(54) MRAM INTEGRATION TECHNIQUES FOR TECHNOLOGY SCALING

(71) Applicant: QUALCOMM Incorporated, San Diego, CA (US)

(72) Inventors: Xia Li, San Diego, CA (US); Yu Lu, San Diego, CA (US); Seung Hyuk Kang, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 99 days.

(21) Appl. No.: 14/109,200

(22) Filed: Dec. 17, 2013

(65) Prior Publication Data

US 2015/0171314 A1    Jun. 18, 2015

(51) Int. Cl.
*H01L 29/82* (2006.01)
*H01L 43/12* (2006.01)
*H01L 27/22* (2006.01)
*G11C 11/16* (2006.01)
*H01L 43/08* (2006.01)

(52) U.S. Cl.
CPC .............. *H01L 43/12* (2013.01); *G11C 11/161* (2013.01); *H01L 27/222* (2013.01); *H01L 43/08* (2013.01)

(58) Field of Classification Search
CPC .................................................. H01L 27/222
USPC ........................................................ 257/421
See application file for complete search history.

(56) References Cited

U.S. PATENT DOCUMENTS

| 6,680,500 | B1 | 1/2004 | Low et al. |
|---|---|---|---|
| 7,906,346 | B2 | 3/2011 | Ueno et al. |
| 8,455,267 | B2 | 6/2013 | Li et al. |
| 8,492,858 | B2 | 7/2013 | Li et al. |
| 2009/0224341 | A1 | 9/2009 | Li |
| 2011/0233696 | A1 | 9/2011 | Li |
| 2012/0032287 | A1 | 2/2012 | Li et al. |
| 2013/0119494 | A1 | 5/2013 | Li et al. |

OTHER PUBLICATIONS

International Search Report and Written Opinion—PCT/US2014/070035—ISA/EPO—Apr. 10, 2015.

*Primary Examiner* — Douglas Menz
(74) *Attorney, Agent, or Firm* — Muncy, Geissler, Olds & Lowe, P.C.

(57) ABSTRACT

A magnetoresistive random-access memory (MRAM) integration compatible with shrinking device technologies includes a magnetic tunnel junction (MTJ) formed in a common interlayer metal dielectric (IMD) layer with one or more logic elements. The MTJ is connected to a bottom metal line in a bottom IMD layer and a top via connected to a top IMD layer. The MTJ substantially extends between one or more bottom cap layers configured to separate the common IMD layer and the bottom IMD layer and one or more top cap layers configured to separate the common IMD layer and the top IMD layer. The MTJ can include a top electrode to connect to the top via or be directly connected to the top via through a hard mask for smaller device technologies. The logic elements include vias, metal lines, and semiconductor devices.

13 Claims, 27 Drawing Sheets

MRAM integration according to Li et al. (US 2012/0032287)

MRAM INTEGRATION TECHNIQUES FOR TECHNOLOGY SCALING

FIELD OF DISCLOSURE

Disclosed embodiments are directed to a Magnetoresistive Random Access Memory (MRAM) integration, and more particularly, exemplary embodiments are directed to techniques for MRAM integration with logic processes that are scalable with advances in device technology and shrinking device sizes.

BACKGROUND

Magnetoresistive Random Access Memory (MRAM) is a non-volatile memory technology that uses magnetic elements. MRAM operation is well known, and can be briefly explained using the example of a commonly used variety of MRAM, a Spin Transfer Torque MRAM (STT-MRAM). A STT-MRAM uses electrons that become spin-polarized as the electrons pass through a thin film (spin filter).

FIG. 1 illustrates a conventional STT-MRAM bit cell 100. The STT-MRAM bit cell 100 includes magnetic tunnel junction (MTJ) storage element 105 (also referred to as "MTJ stack" or "MTJ cell"), transistor 101, bit line 102 and word line 103. MTJ cell 105 is formed, for example, from pinned layer 124 and free layer 120, each of which can hold a magnetic moment or polarization, separated by insulating tunneling barrier layer 122.

Where the design of MTJ cell 105 is that of an in-plane MTJs, an anti-ferromagnetic (AFM) layer and a cap layer (not shown) are used in MTJ cell 105. The AFM layer is used to pin the magnetic moment of the pinned layer of an in-plane MTJ. The cap layer is used as a buffer layer between the MTJ and metal interconnects. Where MTJ cell 105 is designed as a perpendicular MTJ, pinned layer 124 is present but an AFM layer is not included.

The polarization of the free layer can be reversed by applying current in a specific direction such that the polarity of the pinned layer and the free layer are either substantially aligned or opposite. The resistance of the electrical path through the MTJ varies depending on the alignment of the polarizations of the pinned and free layers. This variation in resistance can be used to program and read STT-MRAM bit cell 100, as is known. STT-MRAM bit cell 100 also includes circuit elements, source line 104, sense amplifier 108, read/write circuitry 106 and bit line reference 107. Those skilled in the art will appreciate the operation and construction of STT-MRAM bit cell 100 as known in the art.

As seen from the above example, the formation of a conventional STT-MRAM bit cell involves integration of the various above-described components on a circuit board or semiconductor package. More specifically, memory or storage elements (e.g., MTJ bit cell 105) must be integrated with various other circuit elements (generally referred to herein, as, "logic elements") such as, passive components, metal wires, transistors, logic gates, etc. In general, such integration requires process compatibility between the memory elements and the logic elements.

However, it is well known that semiconductor technology scaling is not uniform across the various components of integrated circuits. For example, with regard to MRAM formation, metal wire width and height of vertical interconnect access (commonly known as "via") are seen to scale by about 70% from one generation to the next. On the other hand, aspects such as height of MTJ bit cells, cap layer thickness, etc., fail to scale at comparable pace.

Applicant's commonly owned US patent application to Li et al. (US Patent Publication 2012/0032287, entitled "MRAM Device and Integration Techniques Compatible with Logic Integration," currently pending and hereinafter referred to as "Li"), discloses various techniques for integration of a logic process (i.e., pertaining to formation of logic elements) with a process of forming MRAM device elements such as MTJ bit cells.

With reference to FIG. 2, a memory device similar to one of Li's disclosed embodiments is illustrated. More particularly, FIG. 2 illustrates a cross-sectional view of memory device 200, which reflects an embodiment of Li, with reference numerals modified and/or added for the purposes of this disclosure. The following nomenclature is applicable to FIG. 2. Elements of memory device 200 are illustrated in three layers identified as "x−1," "x," and "x+1," corresponding to inter metal dielectric (IMD) layers IMDx−1, IMDx, and IMDx+1. The same suffix to identify an IMD layer is also added to metal/via elements present in the corresponding IMD layer. The illustrated elements are shown to be partitioned as "logic" elements, which are juxtaposed with "MTJ" elements.

In more detail, the logic elements are representatively illustrated as vias and metal lines following the above notation, with vias V'x+1 and V'x in layers x+1 and x respectively, and metal lines M'x and M'x−1 in layers x and x−1 respectively.

On the MTJ side, bit cell MTJ 202 is illustrated in layer x, with top electrode (TE) 204, and bottom electrode (BE) 206. Metal line Mx may be coupled to TE 204 in layer x, which can be further coupled to via Vx+1 in layer x+1, through the optional use of a top via top_Vx in layer x. Cap layer Cap3x in layer x is an optional feature for isolation and formation of a metal island for metal line Mx. BE 206 may be coupled to metal line Mx−1 in layer x−1 through via Vx.

Common to both the logic side and MTJ side elements are IMD layers IMDx−1, IMDx, and IMDx+1 in each of the layers x−1, x, and x+1, respectively. These IMD layers are separated by one or more cap layers in the depicted embodiment. The insulating cap layers are diffusion barrier layers for the metal lines and may be formed from insulators such as SiC, SiN film, etc. More specifically, one or more bottom cap layers, bottom-caps 1-2, separate IMD layers, IMDx−1 and IMDx+1, whereas, one or more top cap layers, top-caps 1-2, separate IMD layers IMDx and IMDx+1.

While the memory device 200 of FIG. 2 depicts robust and effective integration of the logic and MTJ side elements in Li for current technologies, technological advances place ever increasing restrictions on the maximum available height in each of the layers x−1, x, and x+1. The height of a layer may be viewed as the separation between cap layers bounding the layers. For example, the height of layer x may be viewed in terms of the distance between bottom cap layers, bottom-caps 1-2, and top cap layers, top-caps 1-2. As future technologies evolve into 20 nm, 16 nm, 10 nm arenas, and beyond, the height of layer x, for example, may shrink to reach dimensions which are so small that the height of layer x will barely be sufficient to accommodate via V'x and metal M'x on the logic side. This is because, as noted above, metal lines and vias can scale relatively rapidly with evolving technologies. However, MRAM technology is unlikely to evolve at the same rate. In other words, with evolving technologies, it will be highly challenging to accommodate the currently illustrated configuration for the MTJ side in layer x, if the height of layer x reaches dimensions which are barely sufficient to accommodate via V'x.

Accordingly, with evolving technology and shrinking device sizes, MTJ 202 may extrude into the metal island Mx.

Further, the metal island Mx may need to be thinned, to the point where metal island Mx may effectively become non-existent. While Li discloses embodiments where components on the MTJ side in layer x may be lowered, such that BE 206 may be sunk deeper, for example, into bottom-cap 2, this may lead to increased stress on the remaining bottom cap layer, bottom-cap 1, as the technology evolves. On the other hand, elevating the position of the components on the MTJ side may begin intruding into the top, x+1 layer.

Accordingly, for numerous reasons, the current approaches for MRAM and logic integration in semiconductor devices may not be viable for future technologies, as device sizes continue to shrink.

SUMMARY

Exemplary embodiments are directed to systems and methods pertaining to magnetoresistive random-access memory (MRAM) integration compatible with shrinking device technologies.

Accordingly, an exemplary MRAM device includes a magnetic tunnel junction (MTJ) formed in a common interlayer metal dielectric (IMD) layer with one or more logic elements. The MTJ is connected to a bottom metal line in a bottom IMD layer and a top via connected to a top IMD layer. The MTJ substantially extends between one or more bottom cap layers configured to separate the common IMD layer and the bottom IMD layer and one or more top cap layers configured to separate the common IMD layer and the top IMD layer. The MTJ can include a top electrode to connect to the top via or be directly connected to the top via through a hard mask for smaller device technologies. The logic elements include vias, metal lines, and semiconductor devices.

Another exemplary embodiment is directed to a method of forming a magnetic tunnel junction (MTJ) in a common interlayer metal dielectric (IMD) layer with one or more logic elements, the method comprising: forming a bottom metal line in a bottom IMD layer; forming one or more bottom cap layers separating the common IMD layer and the bottom IMD layer; forming a bottom electrode contact coupled to the bottom metal line; forming the MTJ on the bottom electrode contact; forming one or more top cap layers separating the common IMD layer and a top IMD layer; and forming a top via in the one or more top cap layers, the top via connected to the MTJ, such that, the MTJ substantially extends between the one or more bottom cap layers and the one or more top cap layers.

Another exemplary embodiment is directed to a magnetoresistive random-access memory (MRAM) device comprising: a magnetic storage means formed in a common insulating means with one or more means for performing a logic function, wherein, the magnetic storage means is connected to a bottom metallic means in a bottom insulating means and a top through interconnection means connected to a top insulating means, wherein the MTJ substantially extends between bottom means for separating the common insulating means and the bottom insulating means and one or more top means for separating the common insulating means and the top insulating means.

Yet another exemplary embodiment is directed to a method of forming a magnetoresistive random-access memory (MRAM) device, the method comprising: patterning a bottom metal line in a bottom IMD layer; forming one or more bottom cap layers separating a bottom IMD layer from a common IMD layer; patterning a bottom electrode hole in the one or more bottom cap layers for forming a bottom electrode and filling the bottom electrode hole with metal for the bottom electrode; depositing a magnetic tunnel junction (MTJ) on the bottom electrode; patterning the MTJ; depositing dielectric material to form the common IMD layer, and performing planarization on top of the MTJ; patterning and depositing logic elements in the common IMD layer; depositing a top cap layer for separating the common IMD layer from a top IMD layer; and patterning a top via hole in the top cap layer and depositing a top via in the top via hole to connect the MTJ to a top metal line in the top IMD layer.

BRIEF DESCRIPTION OF THE DRAWINGS

The accompanying drawings are presented to aid in the description of embodiments of the various embodiments and are provided solely for illustration of the embodiments and not limitation thereof.

DETAILED DESCRIPTION

Aspects of the various embodiments are disclosed in the following description and related drawings directed to specific embodiments. Alternate embodiments may be devised without departing from the scope of the invention. Additionally, well-known elements of the various embodiments will not be described in detail or will be omitted so as not to obscure the relevant details of the various embodiments.

The word "exemplary" is used herein to mean "serving as an example, instance, or illustration." Any embodiment described herein as "exemplary" is not necessarily to be construed as preferred or advantageous over other embodiments. Likewise, the term "embodiments" does not require that all embodiments include the discussed feature, advantage or mode of operation.

The terminology used herein is for the purpose of describing particular embodiments only and is not intended to be limiting of embodiments. As used herein, the singular forms "a", "an" and "the" are intended to include the plural forms as well, unless the context clearly indicates otherwise. It will be further understood that the terms "comprises", "comprising, ", "includes" and/or "including", when used herein, specify the presence of stated features, integers, steps, operations, elements, and/or components, but do not preclude the presence or addition of one or more other features, integers, steps, operations, elements, components, and/or groups thereof.

Exemplary embodiments are directed to design and fabrication of MRAM, and in some aspects, more specifically to improved integration of MRAM or MTJ elements with logic elements as exemplarily applicable to advanced device technologies. In other words, embodiments include designs and layouts of MTJ elements, which are compatible with future device technologies with extremely small and ever shrinking dimensions (e.g., 20 nm, 16 nm, 10 nm, and so on . . . ). However, it will be understood that exemplary embodiments are not to be construed as limited to any particular device technology, current, or future, but on the other hand, the embodiments represent efficient solutions for improved utilization of space and area in integrated circuits or semiconductor devices comprising MRAM integration.

Figure 1:
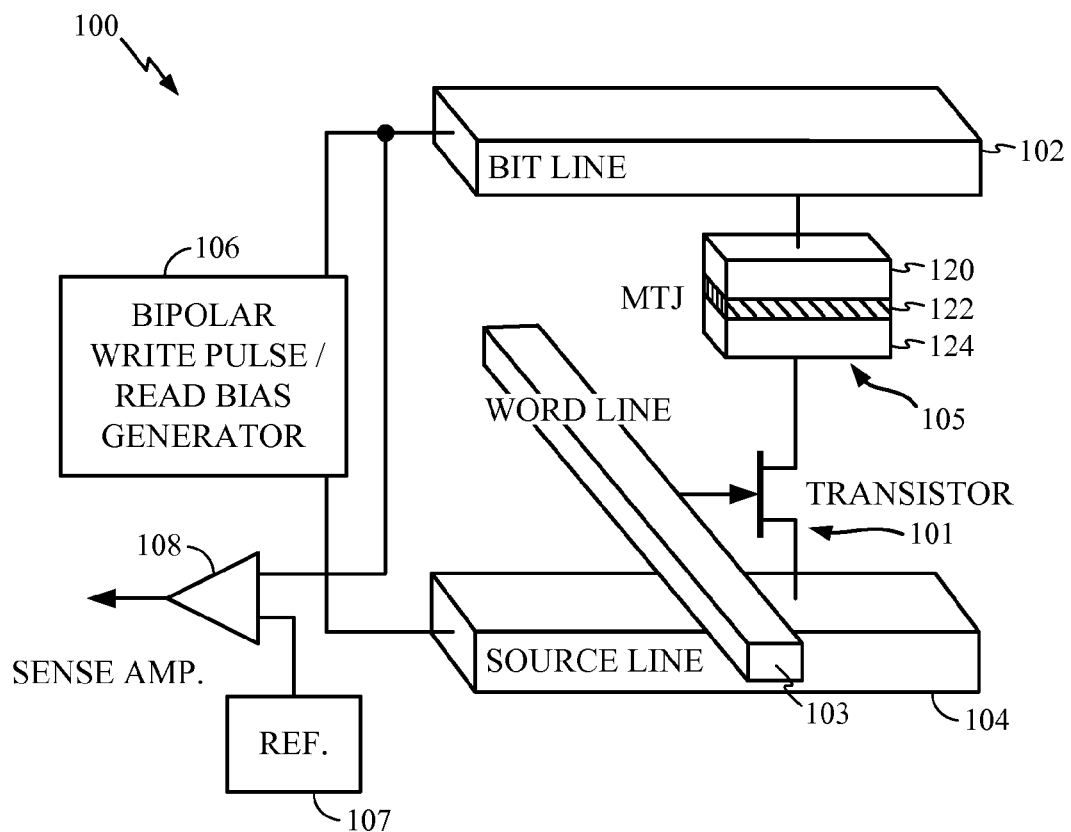
FIG. 1 is an illustration of a conventional MRAM circuit with an MTJ storage element.
Figure 2:
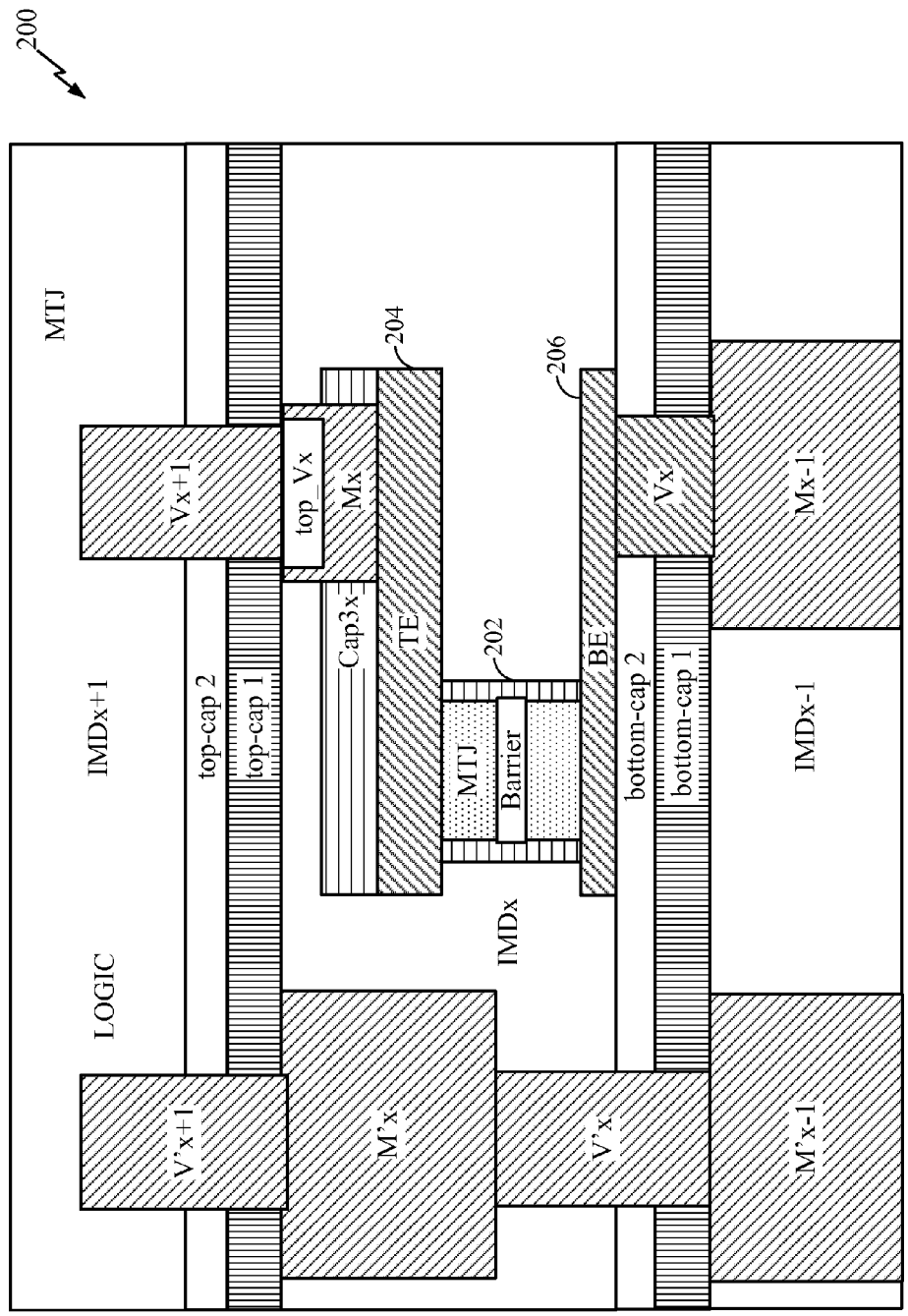
FIG. 2 is a cross-sectional view of a memory device comprising logic elements and MRAM cells according to co-pending application to Li.
Figure 3:
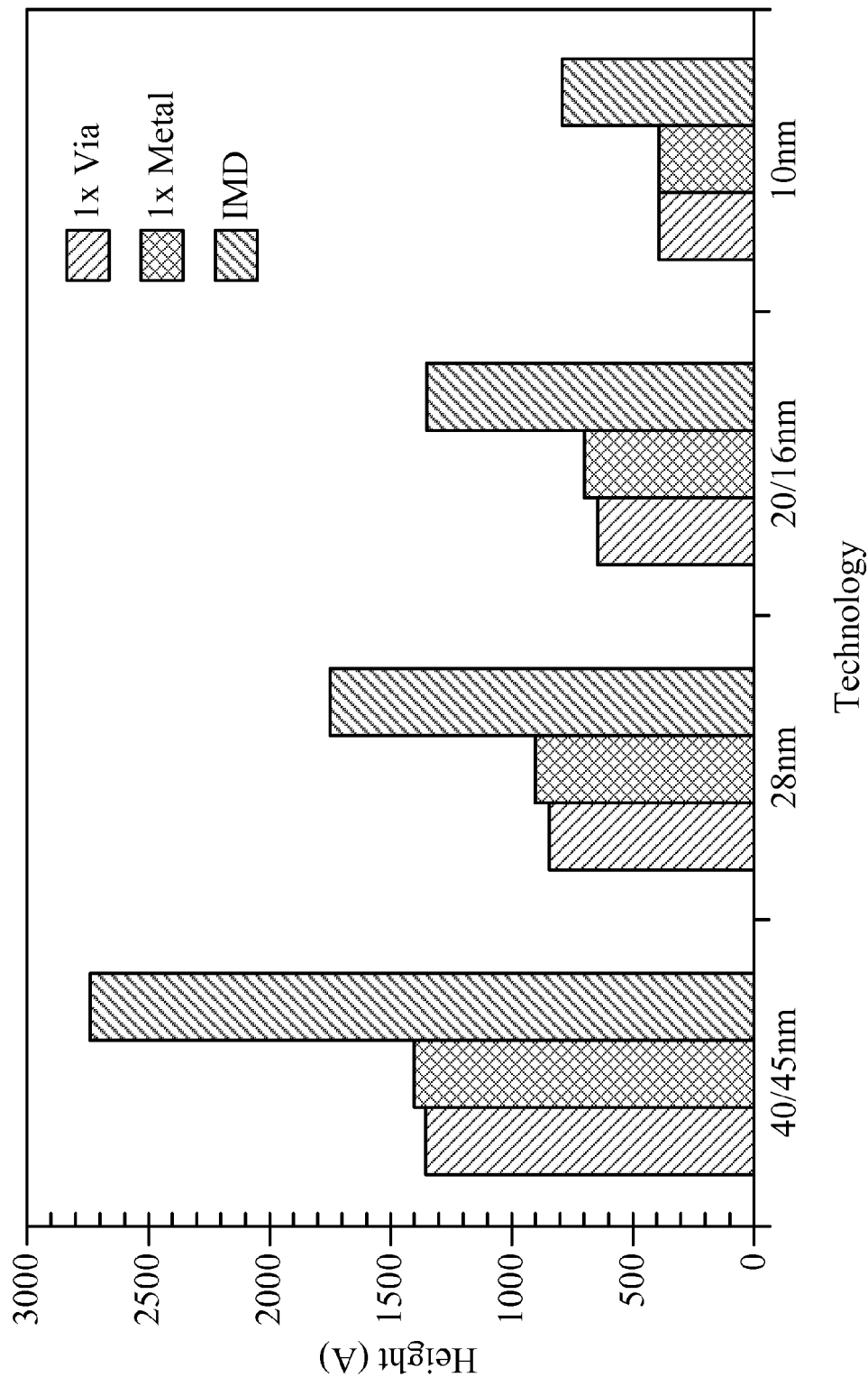
FIG. 3 illustrates trends in device dimensions with advances in device technologies.

With reference to FIG. 3, a trend in device dimensions with advances in device technologies is illustrated. Aspects of FIG. 3 can be explained with reference, again, to FIG. 2. Heights of various above-described components in MRAM integration are illustrated as a function of device technology sizes. More specifically, logical elements are represented by via and metal heights, for example, in a common layer x, as described in FIG. 2. Representatively, height of a common IMD layer (e.g., height of IMDx and additionally, the thickness of bottom caps 1-2) for example is considered, to correspond to the height of layer x. From FIG. 3, it can be gleaned that via and metal heights can scale rapidly. In current technologies, such as 40/45 nm and 28 nm, the IMD height is around 2800 nm and 1700 nm respectively, which allows sufficient room for accommodating MRAM integration structures, such as, those illustrated in FIG. 2. However, as technology advances, the heights of vias and metal lines dramatically reduce, and correspondingly, the height of IMD layers also need to reduce. For example, for 20/16 nm technology, via heights of 650 Å, and for 10 nm technology, via heights of 400 Å, are possible. Correspondingly, for 20/16 nm technology, the IMD height for IMDx (in addition to thickness of bottom caps 1-2) of FIG. 2 would be limited to around 1350 Å, which leaves very little room for accommodating an MTJ bit cell, along with its contacting metal line Mx, such as, for configurations of MTJ 202, as illustrated in FIG. 2. Further, cap layer thickness scales slower than logic in IMDx layer. These problems associated with scaling down of device sizes are seen to be very severe in technologies such as, 10 nm, where the height of the IMDx layer would be restricted to 800 Å.

Accordingly, exemplary embodiments include improvements in design of the MTJ side elements to match the scaling in via and metal line heights in the logic side. In some cases, parameters corresponding to number of top and bottom cap layers, positioning and thickness of cap layers, positioning and thickness of bottom electrodes BE, MTJ top electrode TE and/or hard mask (HM), etc., can be appropriately designed to suit the demands of technological advances, as will be further described below. In some embodiments, one or more logic elements in the common IMD layer are formed such such that a combined height of a via and a metal line formed in the common IMD layer matches a combined height of an exemplary MTJ and the bottom electrode contact.

With reference now to FIGS. 4A-L, a first embodiment along with variations thereof are depicted for exemplary integration of MRAM with logic processes, robust for shrinking device sizes. More specifically, various aspects of memory device 400 are illustrated in these figures. For the sake of consistency and ease of explanation of distinguishing aspects of exemplary embodiments, FIGS. 4A-L adopt similar illustrative characteristics and nomenclature as those of aforementioned memory device 200 of FIG. 2 pertaining to an embodiment of Li. More specifically, like reference numerals are followed for like features, while distinguishing aspects are labeled differently.

With regard to commonalities between FIG. 2 and FIGS. 4A-L, in FIGS. 4A-L, memory device 400 is illustrated with one set of components shown under a "logic" side, and another set of components shown under a "MTJ" side to illustrate integration of MRAM elements, or magnetic storage means, or MTJ elements, compatible logic elements or logic processes. As previously, three layers x−1, x, and x+1 are illustrated, with dielectrics or insulating means shown as IMD layers, IMDx−1, IMDx, and IMDx+1. In general, components belonging to these layers are labeled with an appropriate suffix which identifies the layer in which the component belongs. For example, on the logic side, are illustrated, through interconnection means or vias V'x+1 and V'x and metal lines M'x and M'x−1. The logic side can also include other semiconductor devices, but these are not illustrated, for the sake of clarity. Whereas, on the MTJ side, are illustrated vias Vx+1 and metal line Mx−1. Two means for separating the IMDx−1 and IMDx layers are shown as bottom cap layers, "bottom-cap 1" and "bottom-cap 2" in FIGS. 4A-L, for separating IMDx−1 and IMDx layers. The IMD layers are common to the logic side and the MTJ side. In general, references to a "common IMD layer" are directed to the IMDx layer where the MTJ is formed.

In comparison to FIG. 2, only one means for separating the IMDx and IMDx+1 layers are shown as a top cap layer, "top-cap" which is illustrated as separating IMDx and IMDx+1 layers in FIGS. 4A-L, whereby space taken up by a second top cap layer can be avoided. Two bottom cap layers may still be employed in the embodiments depicted in FIGS. 4A-L to provide stability to formation of MTJ elements which will be further discussed below. As previously noted, FIGS. 4A-L are applicable, for example, to cases where the height of layer x with common IMDx layer, or the separation between top-cap and bottom-caps 1-2 is reduced to keep up with shrinking device sizes (e.g., 20 nm, 16 nm, 10 nm, technologies). Thus, in comparison to FIG. 2, it may be assumed, for the sake of explanation of exemplary aspects (but not as a limitation), that the height of the x layer or separation between top and bottom cap layers is significantly reduced (e.g., in proportion to the advanced device technologies pertaining to shrinking device sizes, where exemplary embodiments may be advantageously applied).

Coming now to some of the distinguishing characteristics, FIGS. 4A-L illustrate variations of MTJ bit cell structures, where MTJ 402 along with TE 404 and BE 406 substantially extends between the bottom cap layers and the top cap layers. In other words, in contrast to memory device 200 of Li, memory device 400 sacrifices a metal line (e.g., Mx in FIG. 2) connected to MTJ 402. Instead, TE 404 is directly connected to via Vx+1 to form connections in layer x+1, thus creating more room for formation of MTJ 402 in the reduced height available in common IMDx layer.

Additionally, in contrast to memory device 200 of Li, memory device 400 of FIGS. 4A-L, may also reduce a horizontal or surface area of BE 406 and TE 404 by aligning them with the body of MTJ 402. This alignment can be understood by referring to FIG. 4M which illustrates a top view of the layout of the MTJ side of memory device 400, which substantially corresponds to most of the variations of memory device 400 seen across FIGS. 4A-L. The MTJ stack of MTJ 402 (which may have a circular horizontal surface area) is aligned or centered with TE 404 which couples to via Vx+1. On the other side, MTJ 402 is coupled to BE 406, which is coupled to Mx−1 through a BE contact (not shown in this view). The horizontal surface area of BE 406, as seen from the top view of FIG. 4M, can vary across FIGS. 4A-L, as will be further explained below.

Figure 4A:
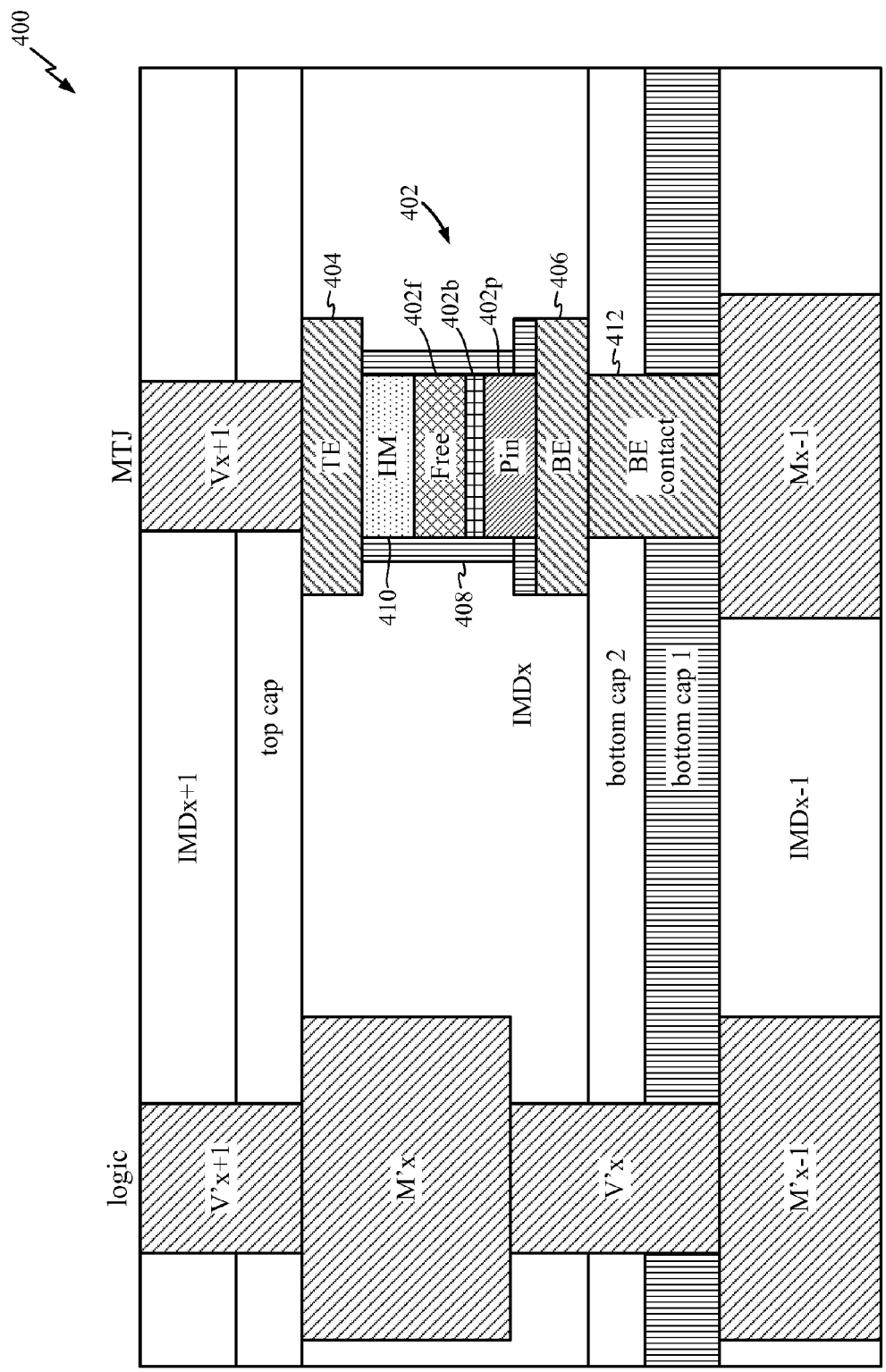
FIGS. 4A-L illustrate variations of an exemplary memory device 400 for MRAM integration compatible with logic processes according to an exemplary embodiment.
Figure 4B:
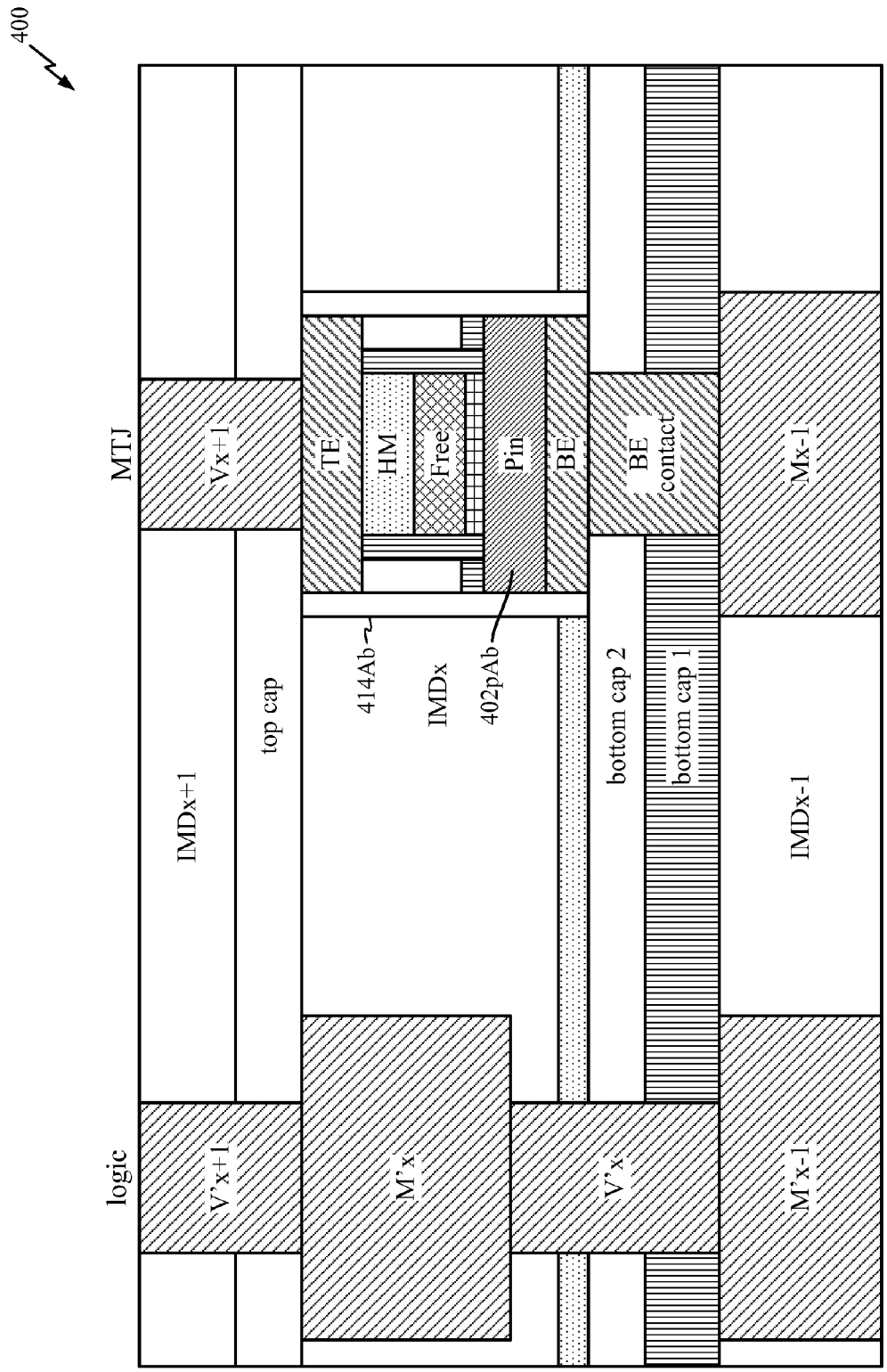
Figure 4C:
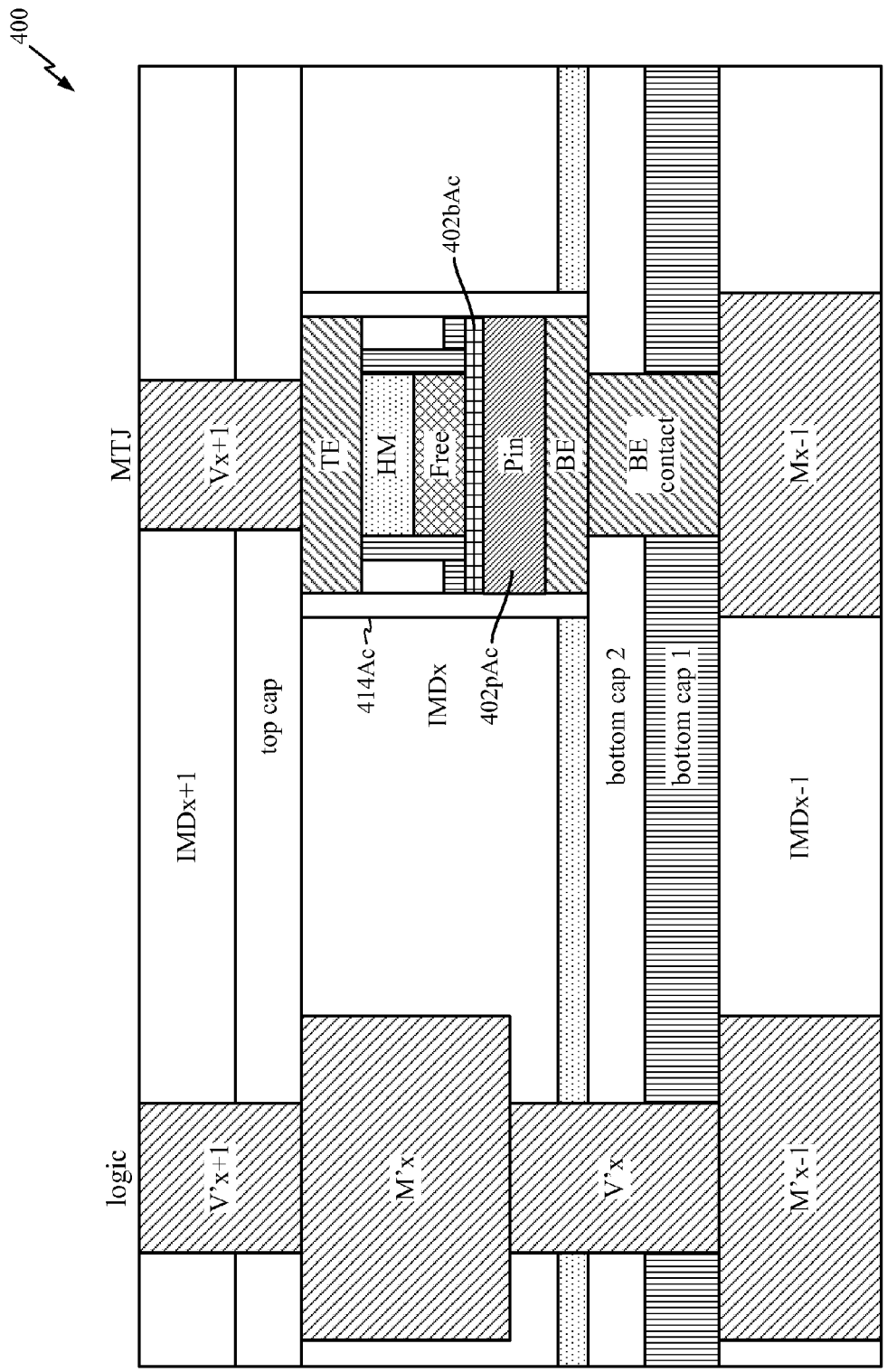

With a further detailed reference to the figures, FIG. 4A provides basic structural details, variations of which are seen across the remaining figures of FIGS. 4B-L. FIG. 4A illustrates, for example, MTJ 402 comprising an MTJ stack, which includes free layer 402f, barrier layer 402b, and pinned layer 402c, where the MTJ stack is centered with TE 404 and BE 406. A bottom contact to metal Mx−1 in the IMDx−1 layer can be formed through a BE contact 412 as shown (alternatively, BE contact 412 may be formed by a via). Although BE contact 412 can be of smaller horizontal surface area than BE 406 (as depicted), thus saving on the amount of metal to be deposited for formation of BE contact 412, this is not a requirement, and BE contact 412 may be formed of any appropriate size. The body of MTJ 402 may be covered by a protective covering, side cap 408. Further, a hard mask HM 410 (e.g., made of conductive material, to protect the MTJ stack and electrically couple MTJ 402 to TE 404) may also be present. FIGS. 4B and 4C represent alternatives of FIG. 4A, which include, in some aspects, intermediate structures which may be involved in arriving at the structure of FIG. 4A described above. In more detail, in FIG. 4B, protective side cap 414Ab can be formed which protects and forms a sidewall that surrounds the entire MTJ structure, including TE 404, BE 406, as well as, an extended pinned layer 402pAb. In FIG. 4C, protective side cap 414Ac additionally covers extended barrier layer 402bAc formed over extended pinned layer 402pAc. Protective side caps 414Ab and 414Ac can protect the variations of MTJ 402 illustrated in FIGS. 4A-C during a two step patterning process, discussed further with reference to FIG. 5 below. In this manner, the elements in the MTJ side can be designed such that they can be accommodated within the reduced height of common IMDx layer, and remain compatible with the integration of the logic side.

Figure 4D:
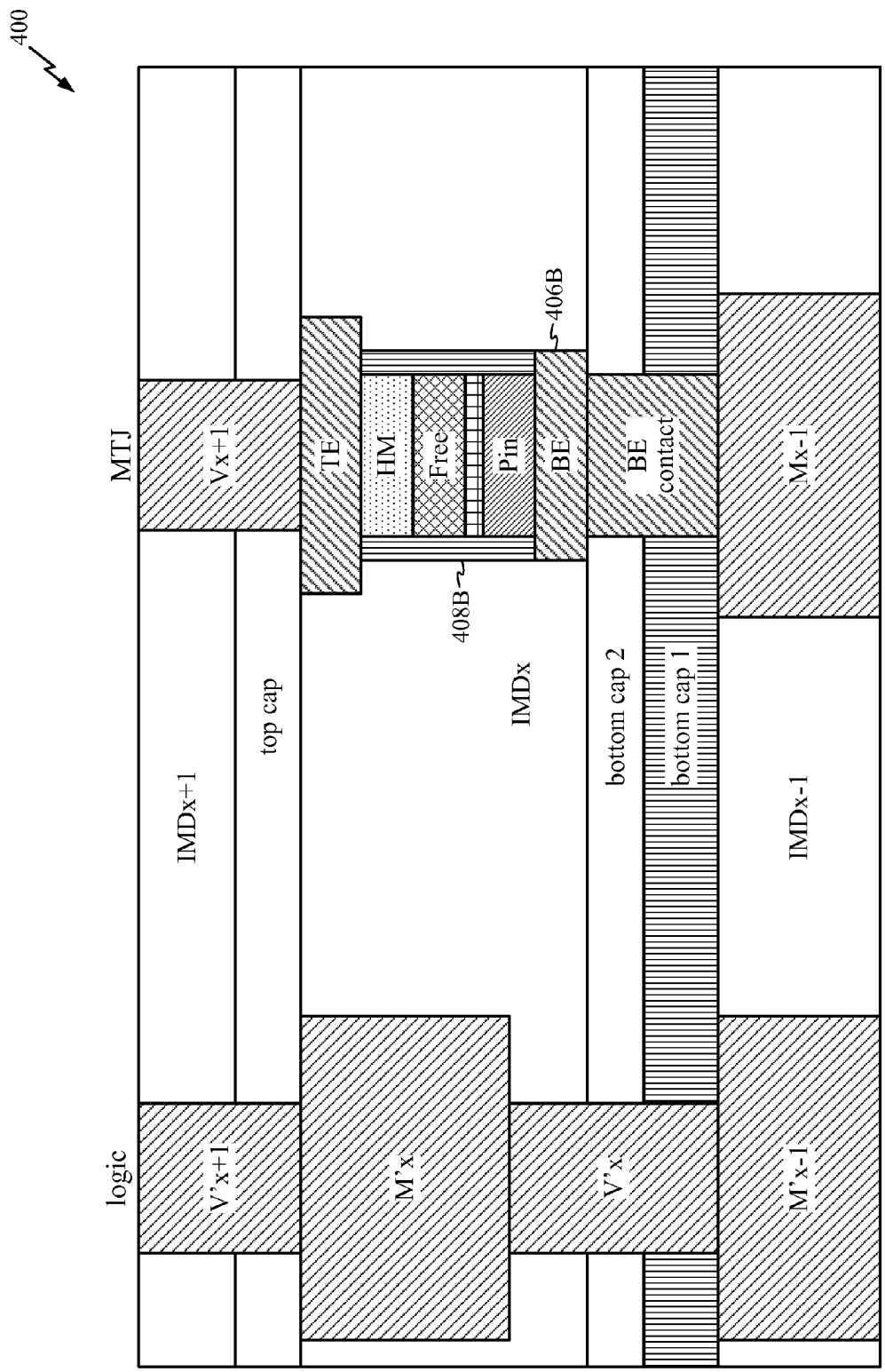
Figure 4E:
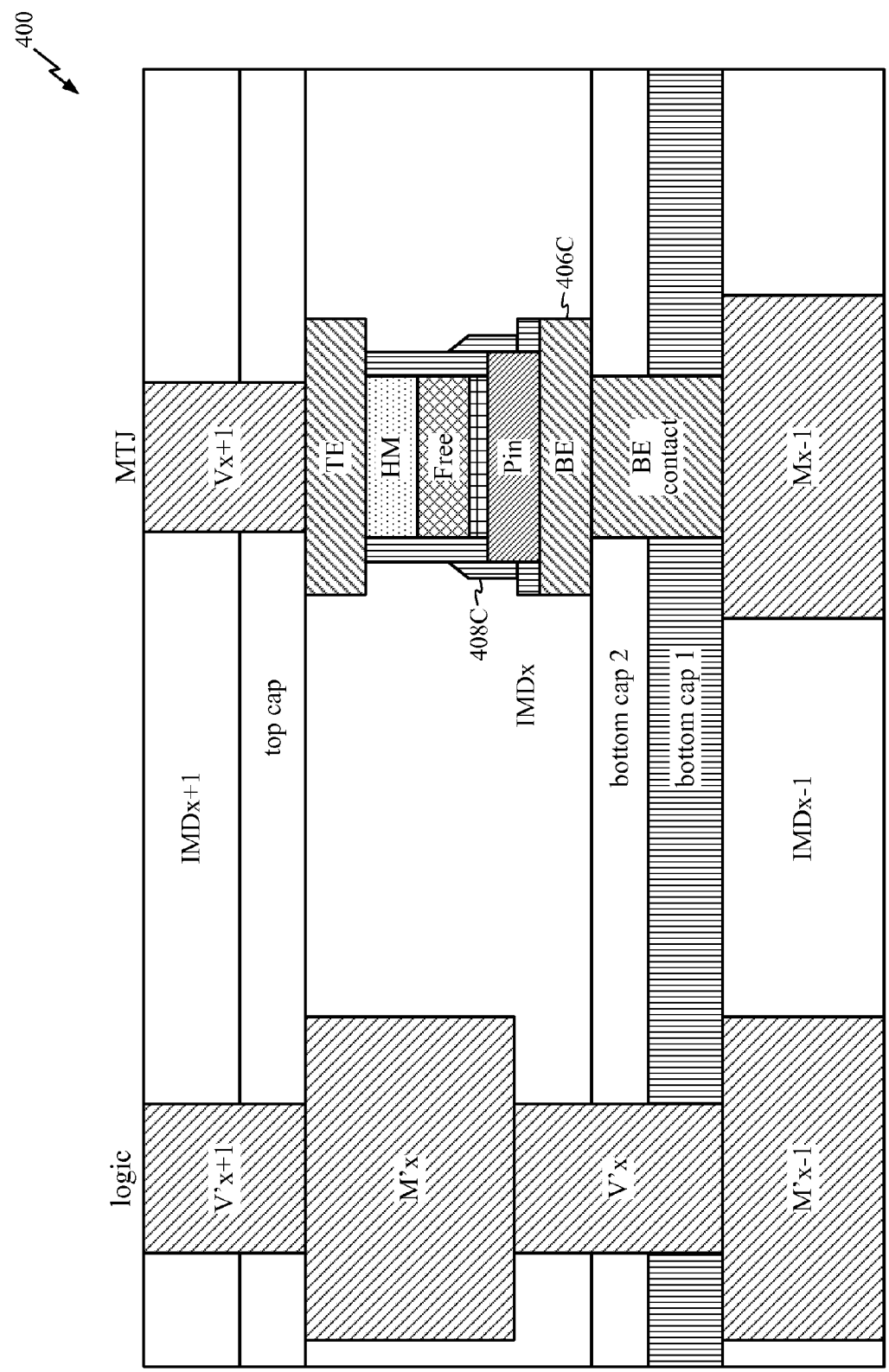
Figure 4F:
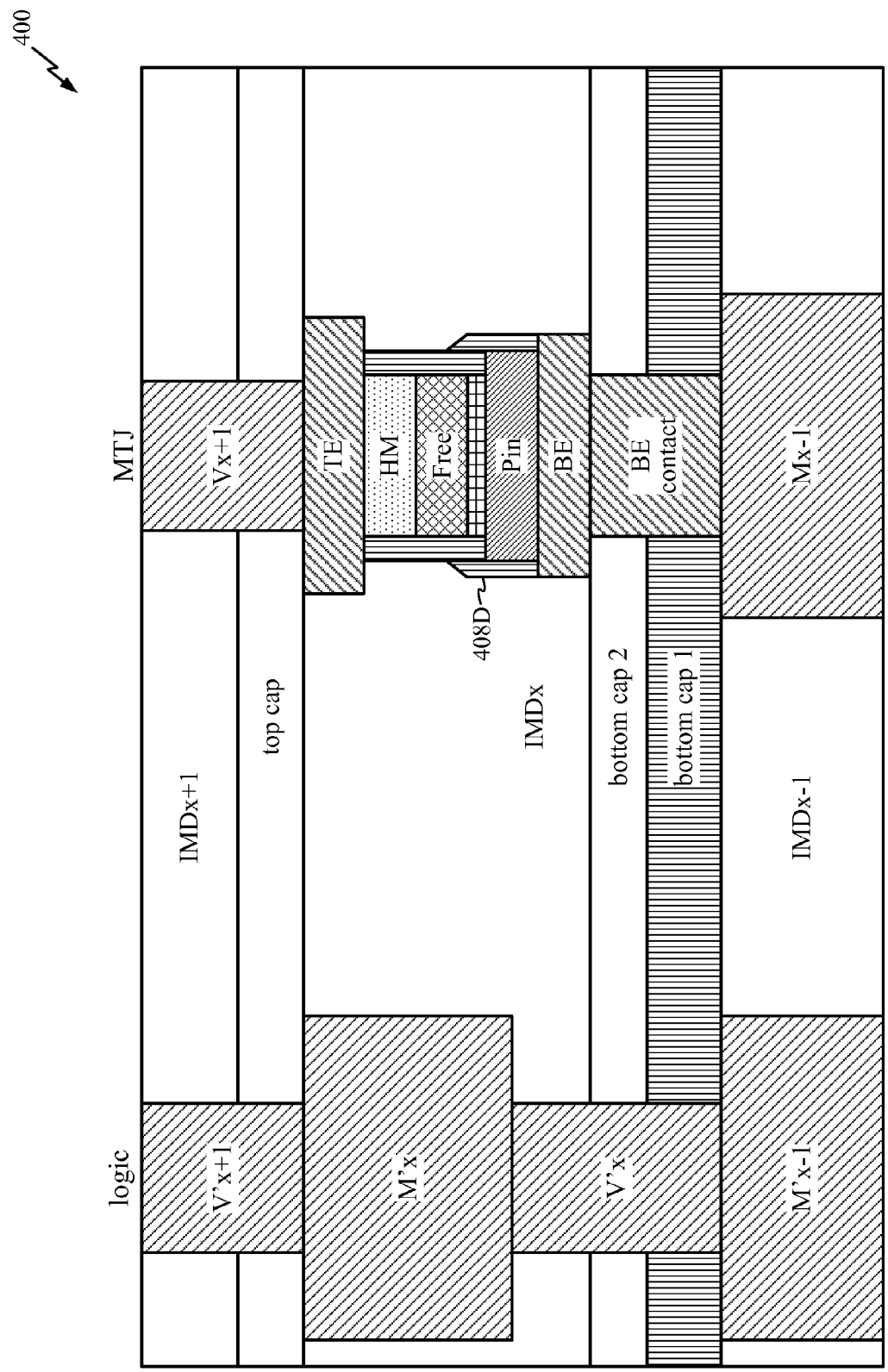

With reference now to FIGS. 4D-F, variations of memory device 400 of FIG. 4A will now be discussed. In FIG. 4D, the horizontal surface area of BE 406B may be reduced, and side cap 408B may be appropriately tailored. In FIG. 4E, the pinned layer of MTJ 402 may be widened, and side cap 408C can be contoured to cover the wider pinned layer; the horizontal surface area of BE 406C can also be appropriately increased or widened. Horizontal segments of side cap 408C are removed in side cap 408D of FIG. 4F.

Figure 4G:
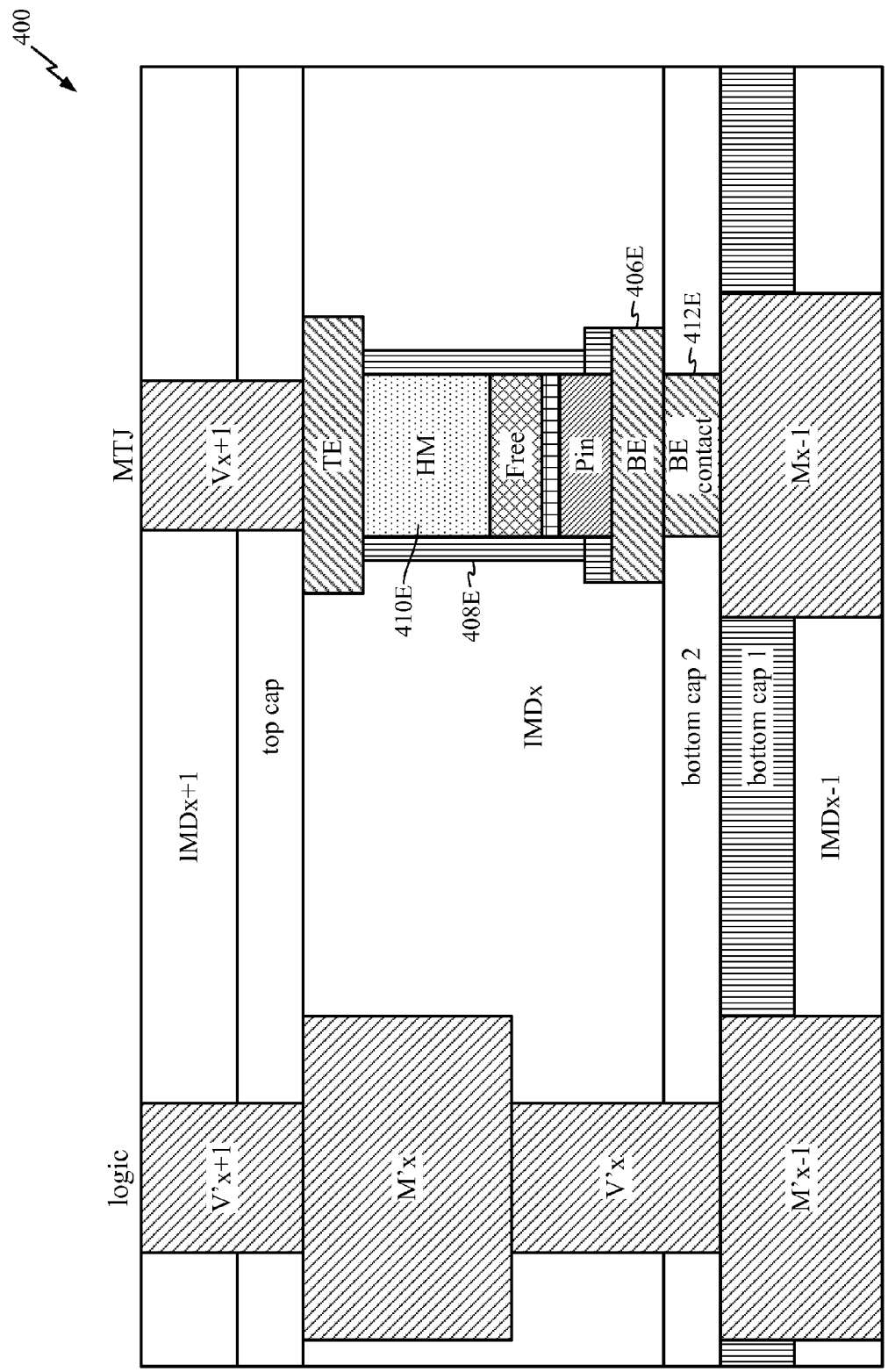
Figure 4H:
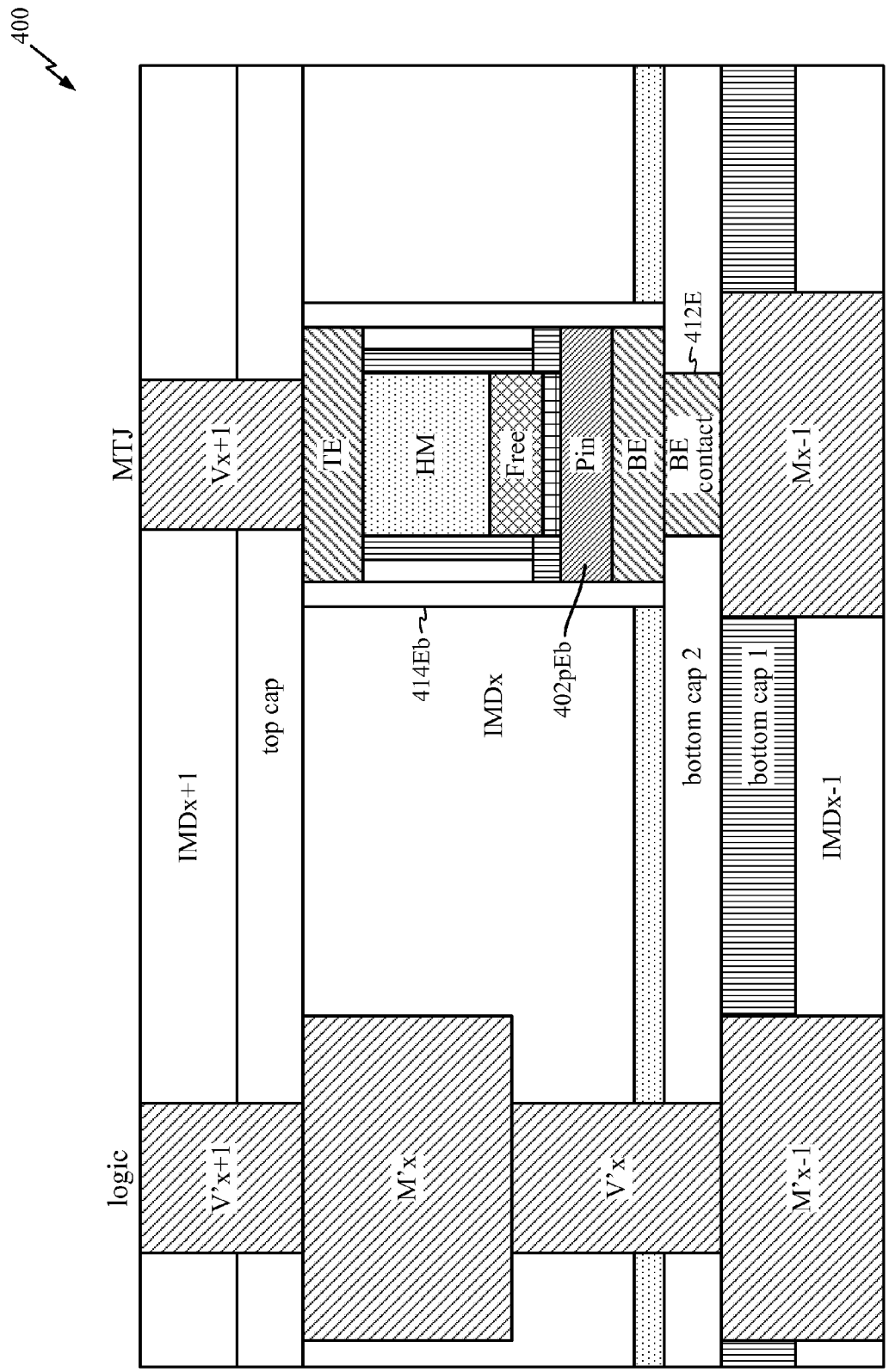
Figure 4I:
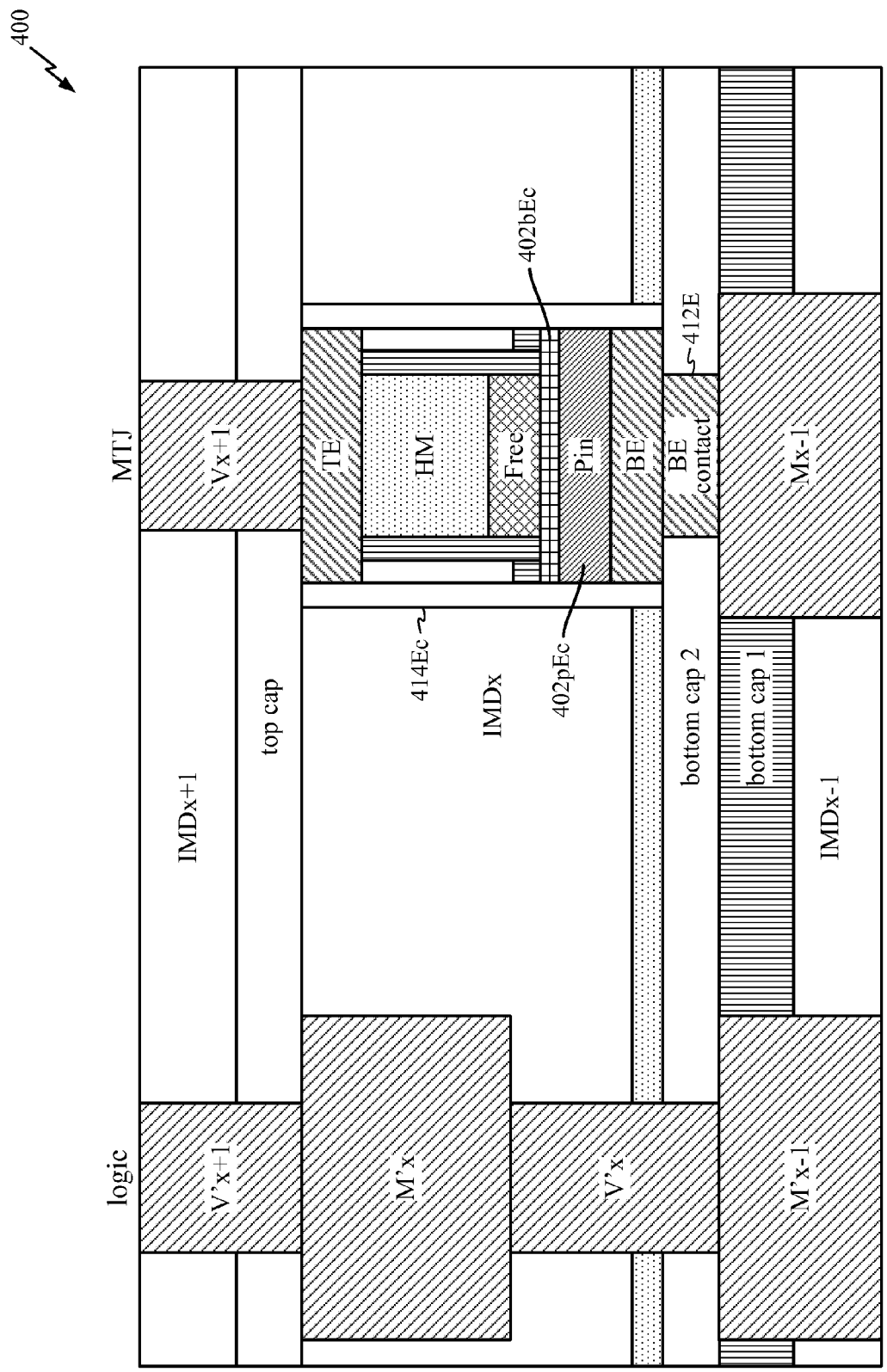

Coming now to FIGS. 4G-L, bottom metal lines M'x−1 and Mx−1 are formed to protrude through bottom-cap 1. In this manner, on the MTJ side, the width of BE contact 412E can be shrunk, and metal line Mx−1 in the lower layer x−1 can be brought closer to MTJ 402. Once again, like FIG. 4A, FIG. 4G represents a basic structure, while FIGS. 4H and 4I represent alternatives of FIG. 4G, which include, in some aspects, intermediate structures which may be involved in arriving at the structure of FIG. 4G. More specifically in FIG. 4G, BE 406E is connected to metal line Mx−1 through BE contact 412E, where BE contact 412E acts as a via through bottom-cap 2. Since this arrangement can clear up some room in the x layer or create additional separation between bottom and top cap layers, HM 410E may be elongated or formed of additional height to couple MTJ 402 to TE 404. Correspondingly, side cap 408E can be enlarged to protect MTJ 402 along with the additional height of HM 410E. With reference to FIG. 4H, protective side cap 414Eb can be formed which protects and forms a sidewall over the entire MTJ structure of FIG. 4G, including TE 404, BE 406E, as well as, an extended pinned layer 402pEb. In FIG. 4I, protective side cap 414Ec additionally covers extended barrier layer 402bEc formed over extended pinned layer 402pEc. Protective side caps 414Eb and 414Ec can protect the variations of MTJ 402 illustrated in FIGS. 4G-I during a two step patterning process, discussed further with reference to FIG. 5 below.

Figure 4J:
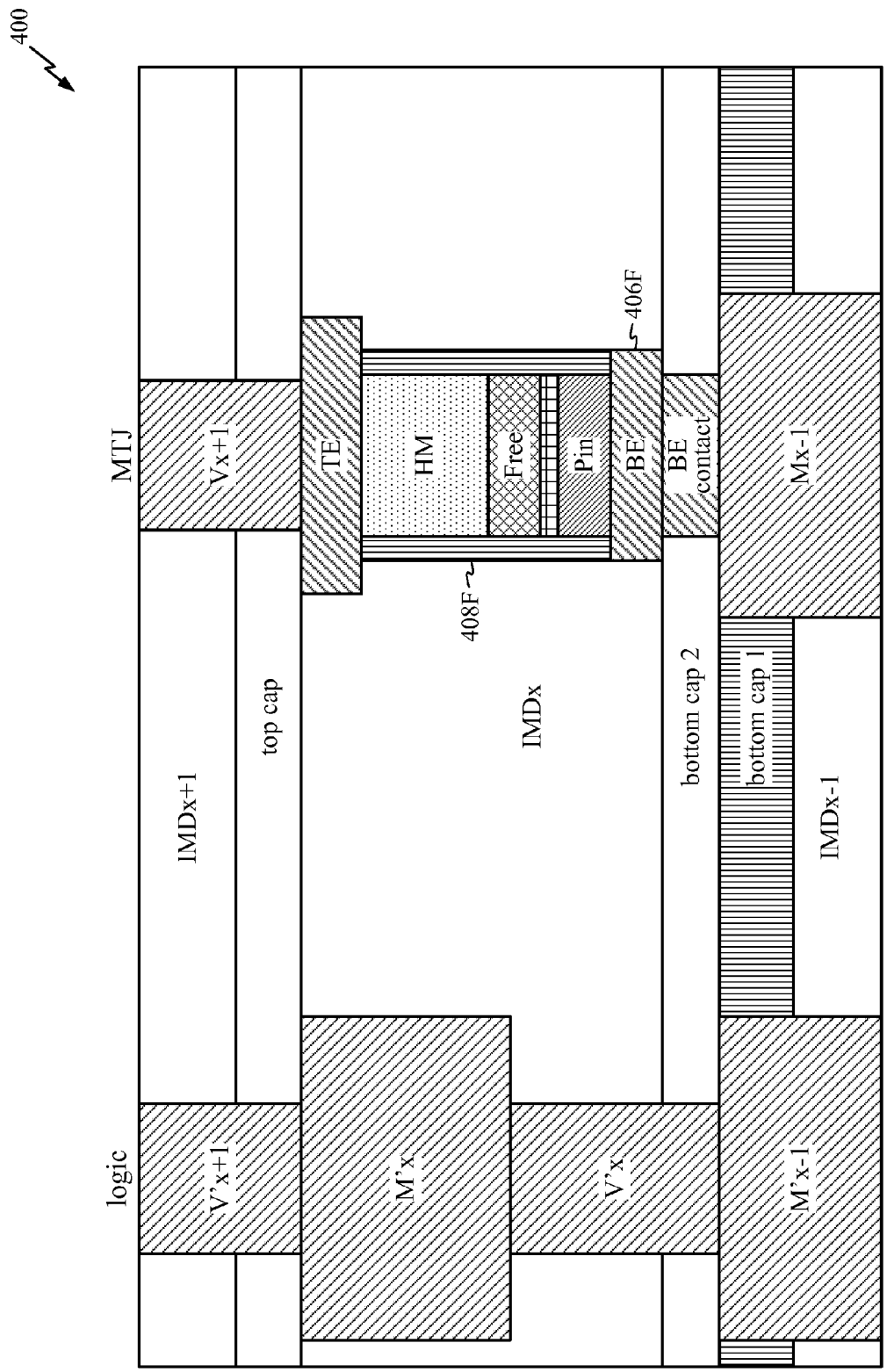
Figure 4K:
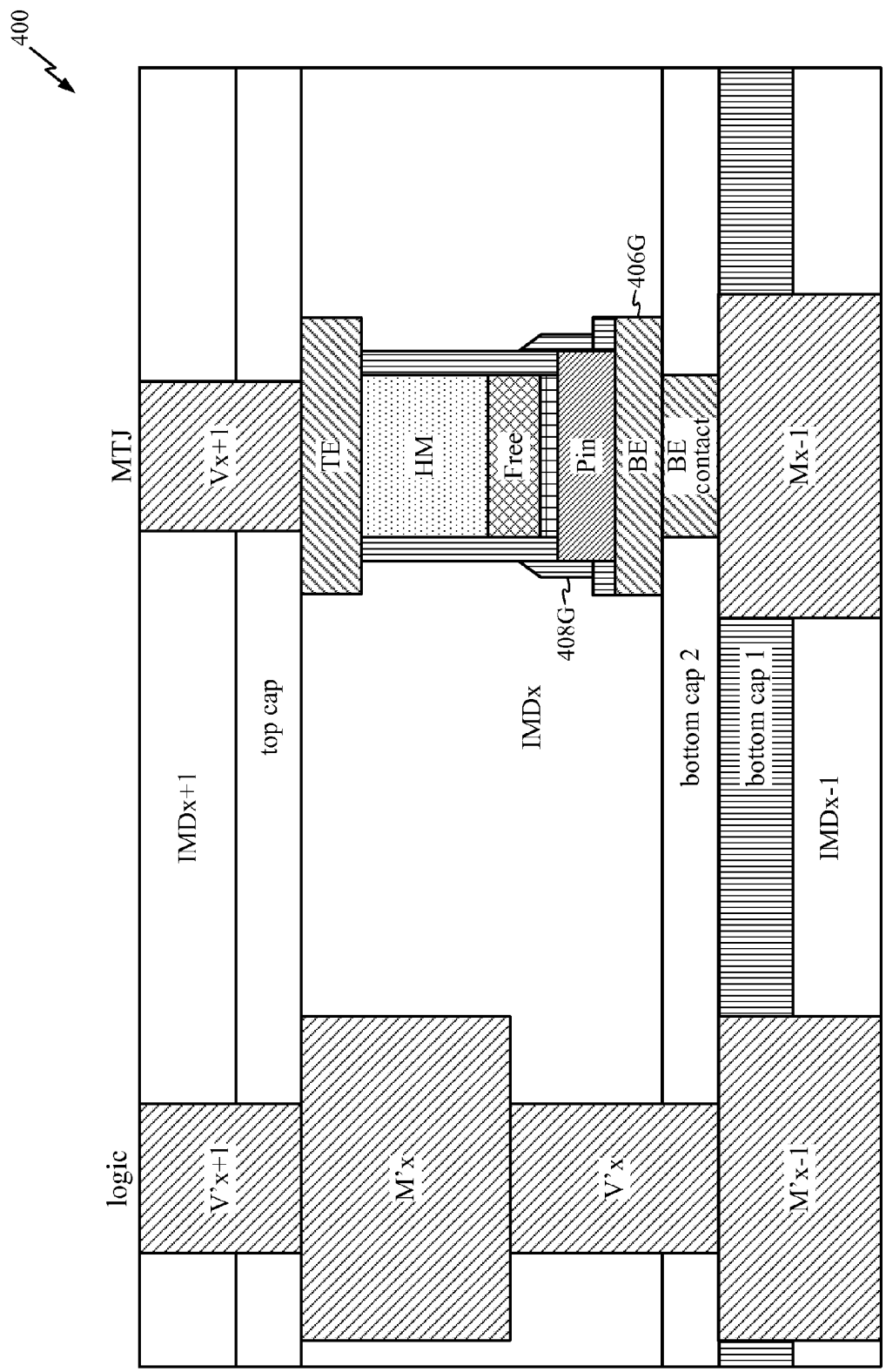
Figure 4L:
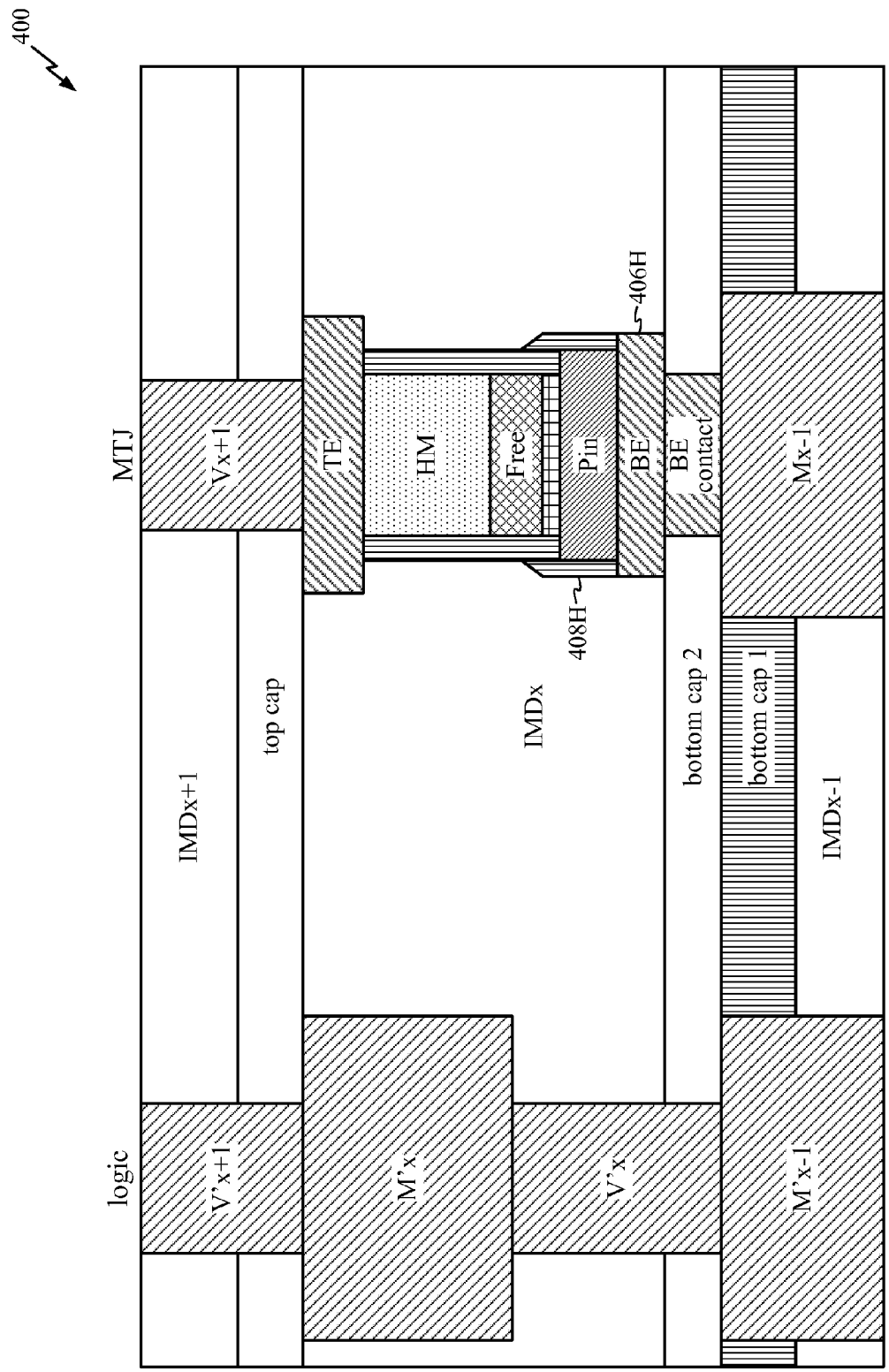

In FIG. 4J, the horizontal surface area of BE 406F is reduced and side cap 408F is correspondingly modified to remove its horizontal segments that were formed on BE 406E in FIG. 4G. In FIG. 4K, the pinned layer of MTJ 402 is widened, the horizontal surface area of BE 406G is increased, and side cap 408G is appropriately contoured. Compared to FIG. 4K, the horizontal surface area of BE 406H is reduced and side cap 408H is correspondingly tailored in FIG. 4L.

Figure 4M:
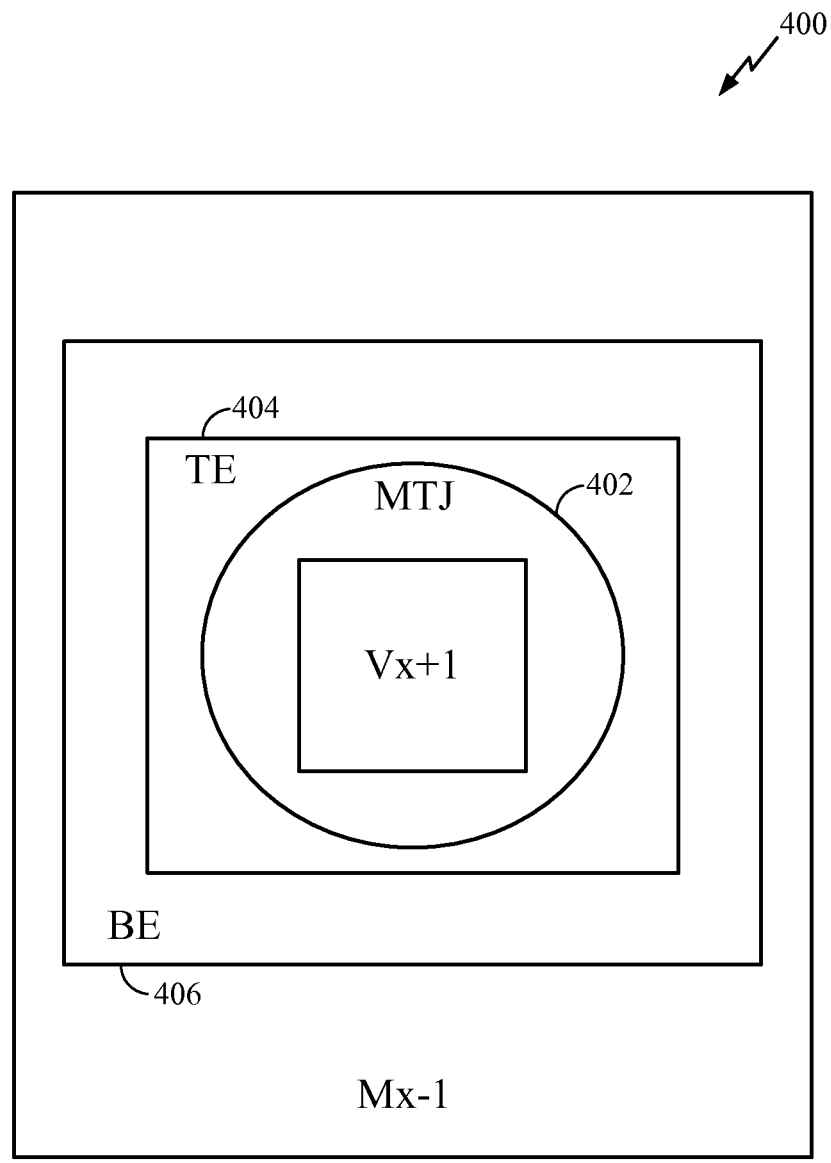
FIG. 4M illustrates a top view of the layout of the MTJ side of memory device 400, which substantially corresponds to most of the variations of memory device 400 seen across FIGS. 4A-L.

With reference again to FIG. 4M, as previously mentioned, a top view of the layout of the MTJ side of memory device 400, which substantially corresponds to most of the variations of memory device 400 seen across FIGS. 4A-L is illustrated. In more detail, as depicted, metal Mx−1 in the IMDx−1 layer is shown to be of a large rectangular area, which is to be treated as the bottom most layer in this top view. On top of this metal Mx−1 layer, is formed, BE 406, of rectangular dimensions in the top view. The MTJ stack, depicted as MTJ 402 is shown in a conventional cylindrical or circular/elliptical shape in the top view, formed on top of BE 406. TE 404 is formed on top of MTJ 402, and via Vx+1 is connected to TE 404 in order to connect MTJ 402 to the top IMDx+1 layer, which may comprise a metal line such as Mx+1 (not shown). It will be understood that the relative dimensions of the elements shown in FIG. 4M are merely for illustrative purposes of an exemplary embodiment, and these relative dimensions and shapes are not to be construed as a limitation.

Figure 5:
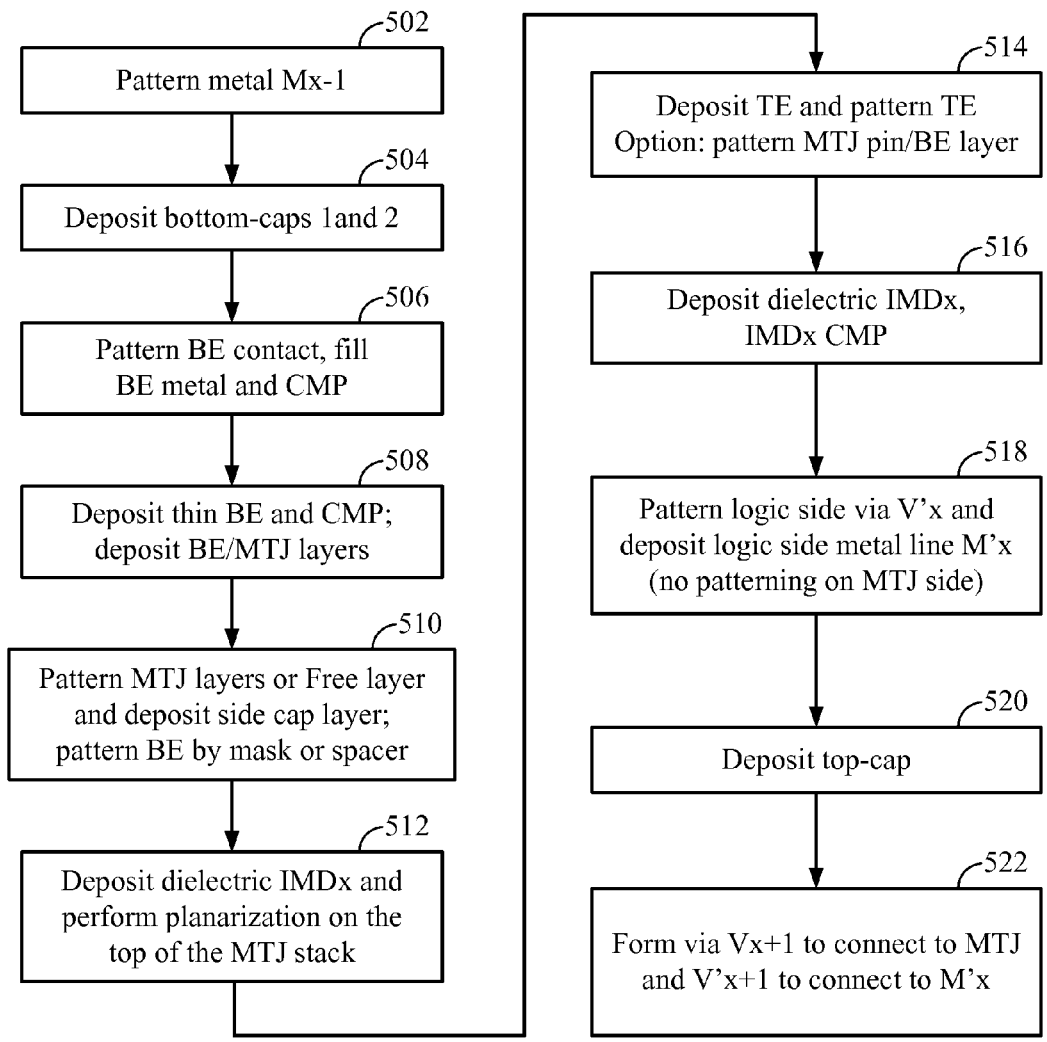
FIG. 5 illustrates a flowchart detailing an exemplary process of forming memory device 400 of FIGS. 4A-L

With reference now to FIG. 5, a flowchart detailing an exemplary process of forming memory device 400 is illustrated. The flowchart includes the following process: metal line Mx−1 (as well as, metal line M'x−1 for the logic side) in IMDx−1 in layer x−1 is patterned—Block 502; insulating bottom cap layers bottom-caps 1 and 2 in layer x can be deposited next—Block 504; the bottom cap layers are patterned to make room for a BE contact (e.g., BE contact 412E), metal is deposited to form the BE contact, and chemical mechanical polishing (CMP) is performed prior to depositing MTJ layers—Block 506; in some aspects, a thin BE layer (not explicitly shown) is then deposited and a short CMP is performed, following which a BE (e.g., BE 404) and MTJ layers or MTJ stack (e.g., MTJ 402, comprising, for example, a pinned layer, barrier layer, free layer, and HM 410) are deposited on the thin BE layer—Block 508; the MTJ layers (or in some aspects, the free layer, such as, 402f, of MTJ 402) are patterned and a side cap layer (e.g., side cap 408) are deposited, following which, the pinned layer (e.g., pinned layer 402p) and BE are patterned, using either a mask or a spacer, or by a TE mask—Block 510; common IMDx is deposited in the regions between the MTJ side and the logic side in layer x, and planarization is performed on top of the MTJ—Block 512; a TE (e.g., TE 404) is deposited on the MTJ stack and the TE is patterned, where, optionally the MTJ stack or the pinned layer BE layer are patterned according to a two-step MTJ etch which involves a protective side cap (e.g., according to FIGS. 4A-C; 4G-I)—Block 514; dielectric IMDx is deposited again, in order to fill open regions of layer x, following which IMD CMP process can be used for the planarization of IMDx layer—Block 516; bottom-caps 1 and 2 are patterned and via V'x for the logic side is created through bottom-caps 1 and 2, and metal line M'x/via V'x for the logic side in layer x can be deposited, while taking care not to pattern on the MTJ side—Block 518; top-cap 1 can be deposited over the TE on the MTJ side, and the metal line M'x on the logic side—Block 520; and top-cap is patterned to form vias, Vx+1 on the MTJ side to connect to the TE and V'x+1 to connect to metal line M'x on the logic side—Block 522.

In the above-described process of FIG. 5, three masks may be needed in the case of memory device fabricated according to FIGS. 4A-L, where a first mask is for the BE contact formation discussed in Blocks 506-508, a second mask for formation of the MTJ stack as discussed in Blocks 508-510, and a third mask for formation of the TE connection with the top of the MTJ as discussed in Block 514. It is seen that memory device 400 is fully compatible with the logic processes (e.g., Blocks 502-504 and 518-522).

With reference now to FIGS. 6A-H, a second embodiment along with variations thereof are depicted for exemplary integration of MRAM with logic processes, robust for shrinking device sizes. More specifically, various aspects of memory device 600 are illustrated in these figures. For the sake of consistency and ease of explanation of distinguishing aspects of exemplary embodiments, FIGS. 6A-L adopt similar illustrative characteristics and nomenclature as those of aforementioned memory device 200 of FIG. 2 and device 400 of FIGS. 4A-L. More specifically, like reference numerals are followed for like features, while distinguishing aspects are labeled differently. A detailed explanation of common aspects will not be repeated herein, for the sake of brevity.

Briefly, as in FIG. 2 and FIGS. 4A-L, in FIGS. 6A-H, memory device 600 is illustrated with one set of components shown under a "logic" side, and another set of components shown under a "MTJ" side to illustrate integration of MRAM or MTJ elements with a logic process. As previously, three layers x−1, x, and x+1 are illustrated, with common IMD layers, IMDx−1, IMDx, and IMDx+1 and components belonging to these layers are labeled with an appropriate suffix which identifies the layer in which the component belongs. For example, on the logic side, are illustrated, vias V'x+1 and V'x and metal lines M'x and M'x−1. Whereas, on the MTJ side, are illustrated vias Vx+1 and metal line Mx−1. Two bottom cap layers, bottom-caps 1 and 2 are illustrated for separating IMDx−1 and IMDx layers and one top cap layer, top-cap is illustrated as separating IMDx and IMDx+1 layers. As in the case of FIGS. 4A-L, FIGS. 6A-H also depict aspects where the height of layer x with common IMDx layer, or the separation between top-cap and bottom-caps 1-2 is reduced to keep up with shrinking device sizes (e.g., 20 nm, 16 nm, 10 nm, technologies), for example, in comparison to FIG. 2.

On the other hand, with regard to differences of memory devices 600 and 400, FIGS. 6A-H generally pertain to embodiments which sacrifice a top electrode (TE) formation over MTJ bit cell structures, thus creating more room for integration of the MTJ side elements. Instead of forming a separate TE, memory device 600 utilizes the conductive hard mask (HM) which is already present in an exemplary MTJ stack to connect to the via Vx+1 which connects to IMDx+1 layer in layer x+1. Thus, in some non-restrictive aspects, memory device 600 may be considered to be applicable to device technologies which are further advanced (i.e., offer even less height for MTJ side integration) than memory device 400; although this is not necessary, and memory device 600 may be chosen as a matter of design choice even if memory device 400 may also be applicable to a particular MRAM integration effort.

More specifically, FIGS. 6A-H illustrate variations of memory device 600 where MTJ 602 includes HM 610, which is directly coupled to via Vx+1 on the MTJ side, in layer x, without an intermediate TE. Remaining aspects of FIGS. 6A-H are substantially to FIGS. 4A-L, and will be discussed in additional detail in the following sections. Similar to memory device 400 of FIGS. 4A-L, memory device 600 of FIGS. 6A-H may also reduce a horizontal or surface area of BE 606 by aligning BE 606 with the body of MTJ 602. This alignment can be understood by referring to FIG. 6I which illustrates a top view of the layout of the MTJ side of memory device 600, which substantially corresponds to most of the variations of memory device 600 seen across FIGS. 6A-H. The MTJ stack of MTJ 602 (which may have a circular horizontal surface area) is aligned or centered with via Vx+1, and coupled to via Vx+1 through HM 610 (not shown in this view). On the other side, MTJ 602 is coupled to BE 606 as before, which is coupled to Mx−1 through a BE contact (also not shown in this view). The horizontal surface area of BE 606, as seen from the top view of FIG. 6I, can vary across FIGS. 6A-H, as will be further explained below.

Figure 6A:
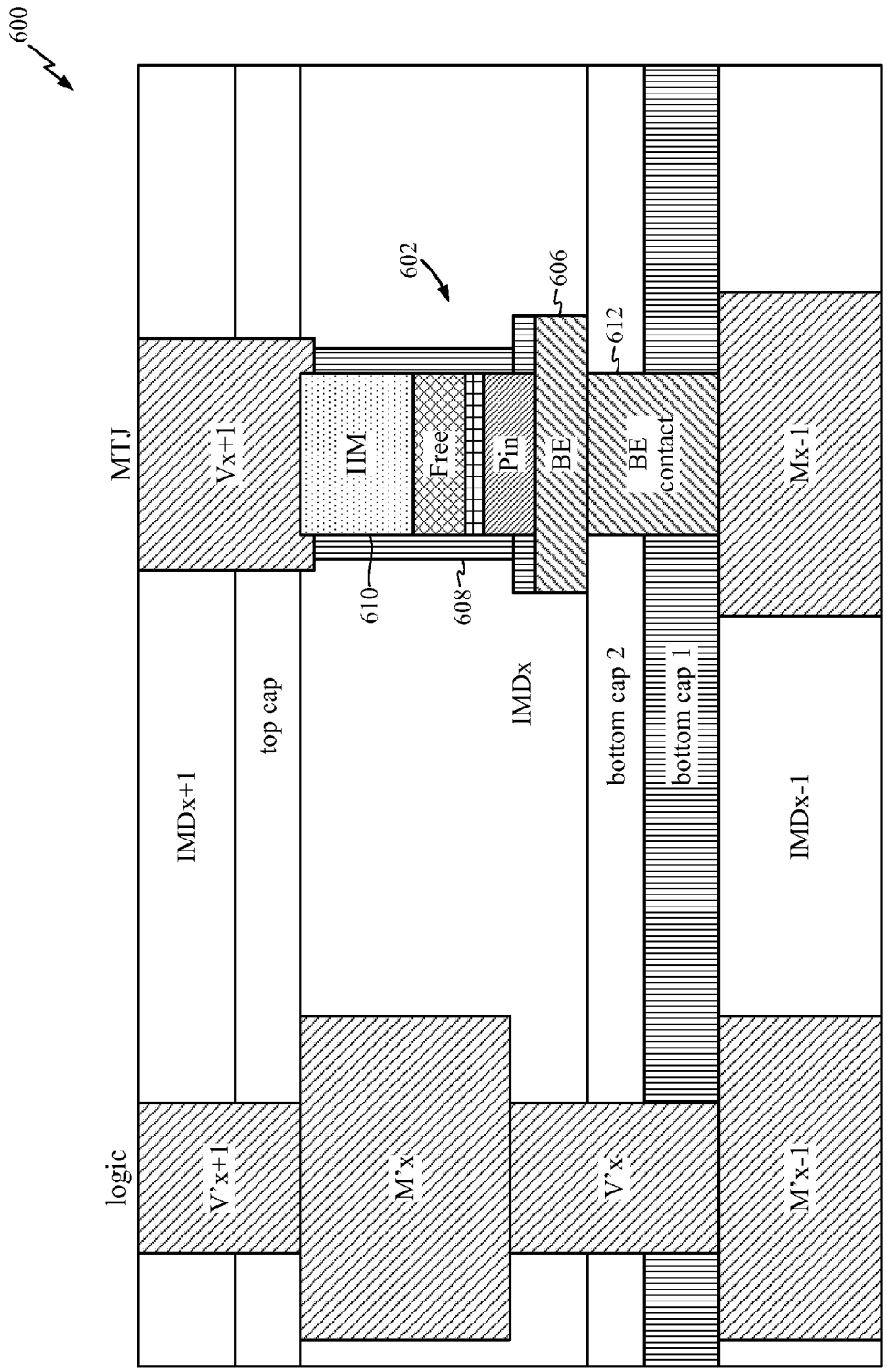
FIGS. 6A-H illustrate variations of an exemplary memory device 600 for MRAM integration compatible with logic processes according to an exemplary embodiment.

With a further detailed reference to FIG. 6A, for example, MTJ 602 comprises a free layer, a barrier layer, and a pinned layer which form the MTJ stack, and are centered or aligned with BE 606. A bottom contact to metal Mx−1 in the IMDx−1 layer can be formed through a BE contact 612 as shown (alternatively, BE contact 612 may be formed by a via). Although BE contact 612 can be of smaller horizontal surface area than BE 606 (as depicted), thus saving on the amount of metal to be deposited for formation of BE contact 612, this is not a requirement, and BE contact 612 may be formed of any appropriate size. The body of MTJ 602 may be covered by a protective covering such as, side cap 408. As already mentioned, HM 610 (e.g., made of conductive material, to protect the MTJ stack) is electrically coupled to via Vx+1 for connecting MTJ 602 in layer x to elements such as, a metal line Mx+1 (not shown) in layer x+1. As seen, memory device 600 also satisfies requirements of compatible MRAM integration with logic processes, where the MTJ side elements are designed such that they can be accommodated within the reduced height of common IMDx layer.

Figure 6B:
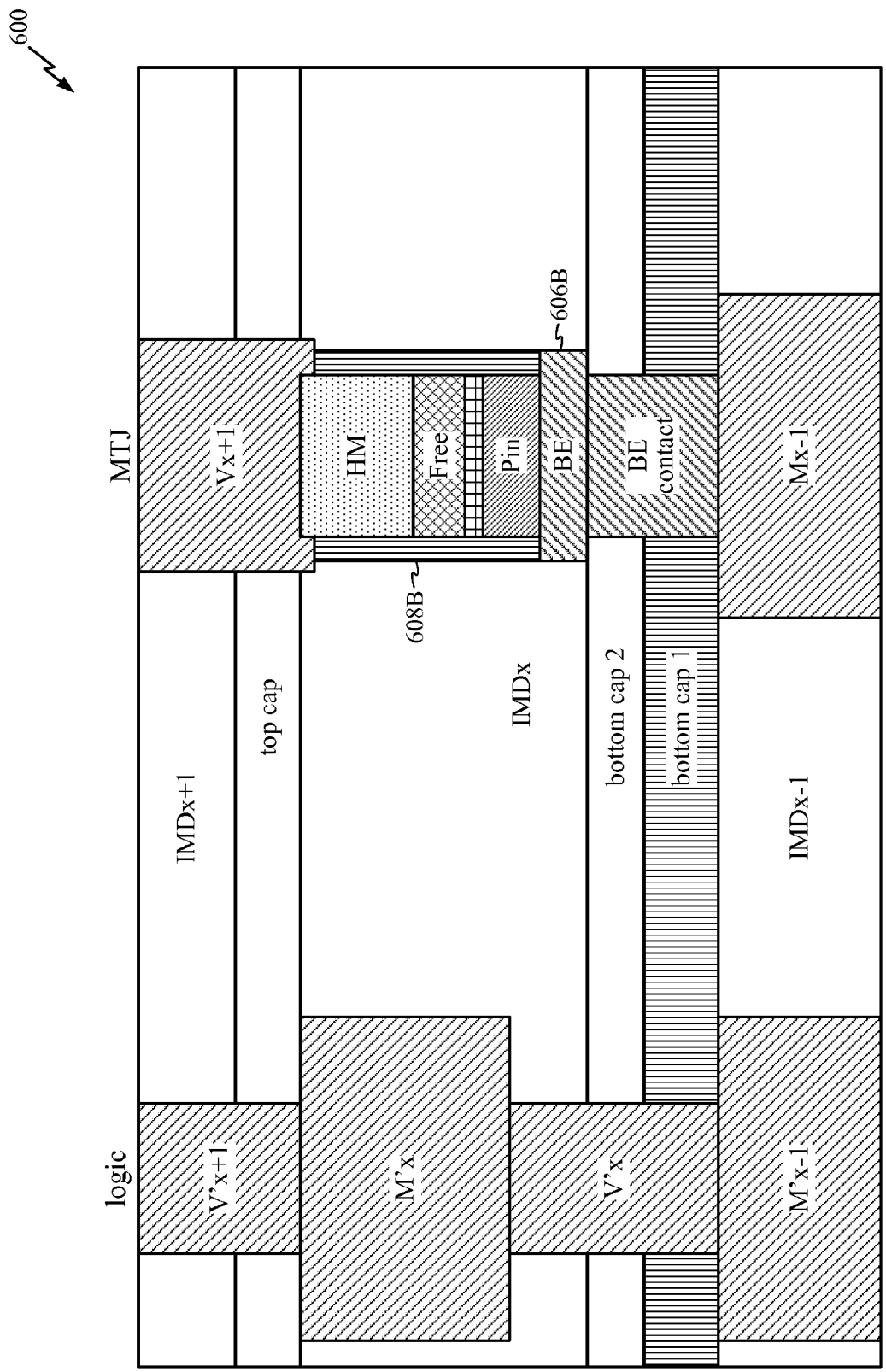
Figure 6C:
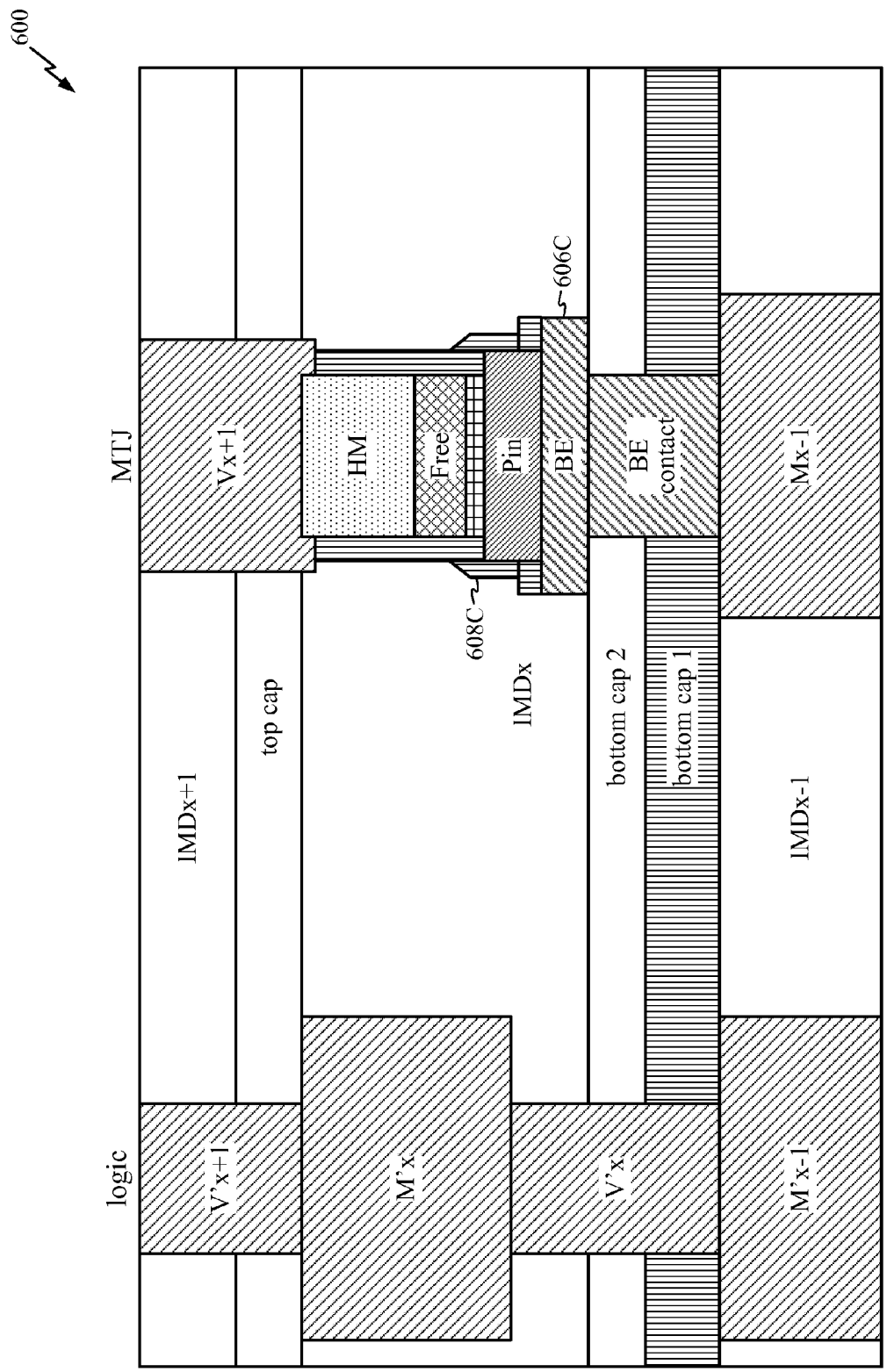
Figure 6D:
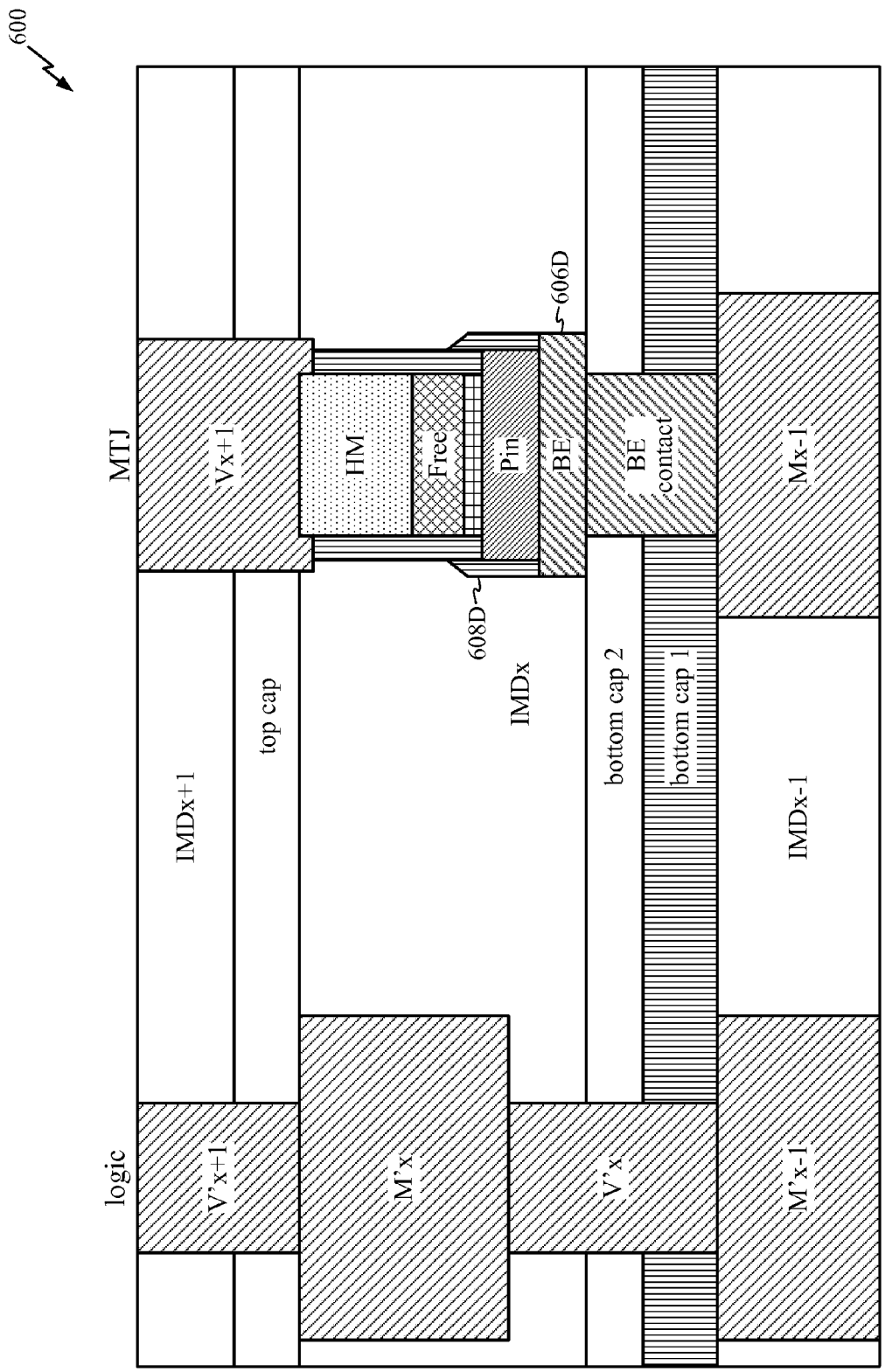
Figure 6E:
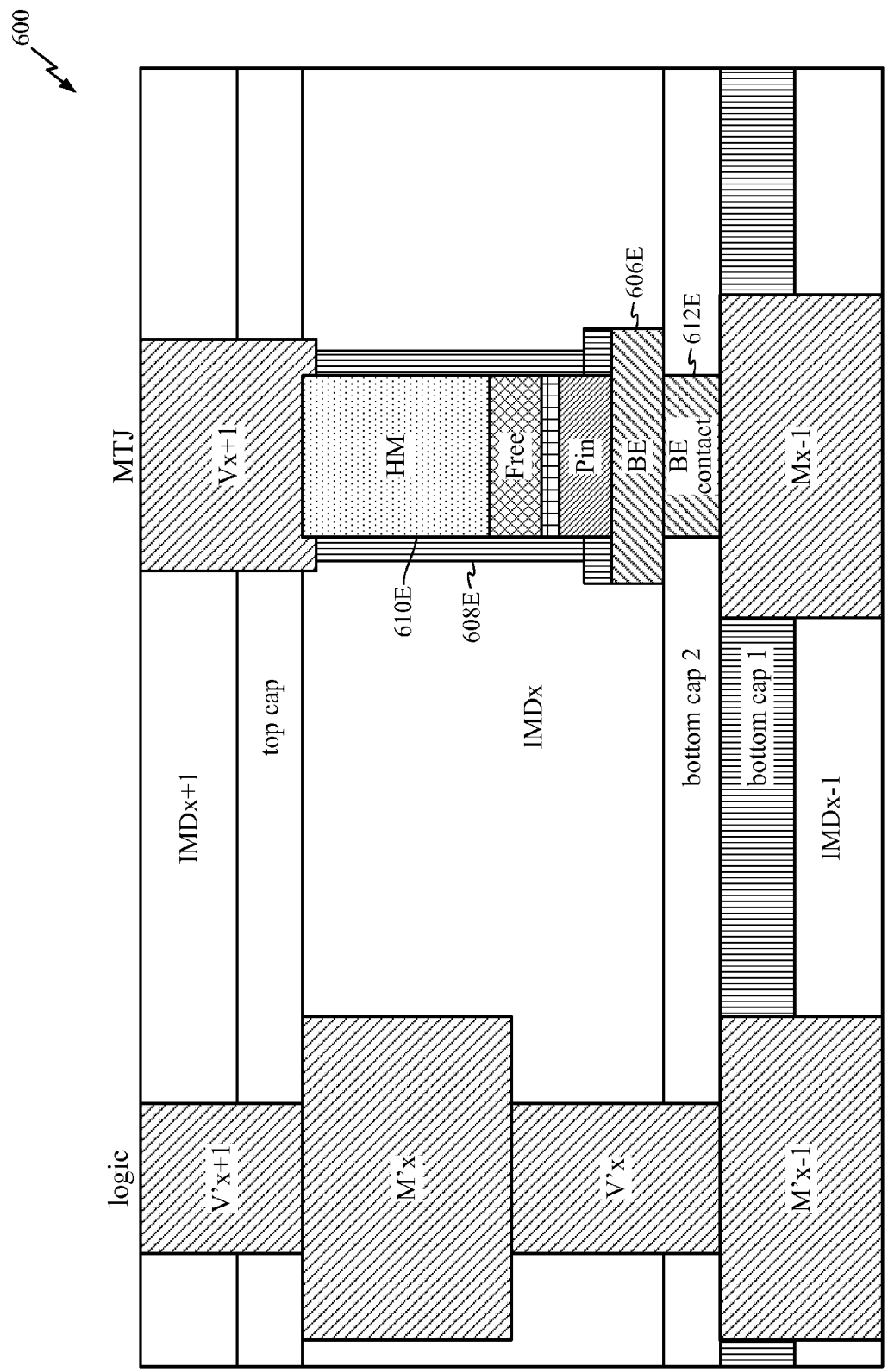

With reference now to FIGS. 6B-D, variations of memory device 600 of FIG. 6A will now be discussed. In FIG. 6B, the horizontal surface area of BE 606B may be reduced, and side cap 608B may be appropriately tailored. In FIG. 6C, the pinned layer of MTJ 602 may be widened, and side cap 608C can be contoured to cover the wider pinned layer; the horizontal surface area of BE 606C can also be appropriately increased or widened. Horizontal segments of side cap 608C are removed in side cap 608D of FIG. 6D.

Figure 6F:
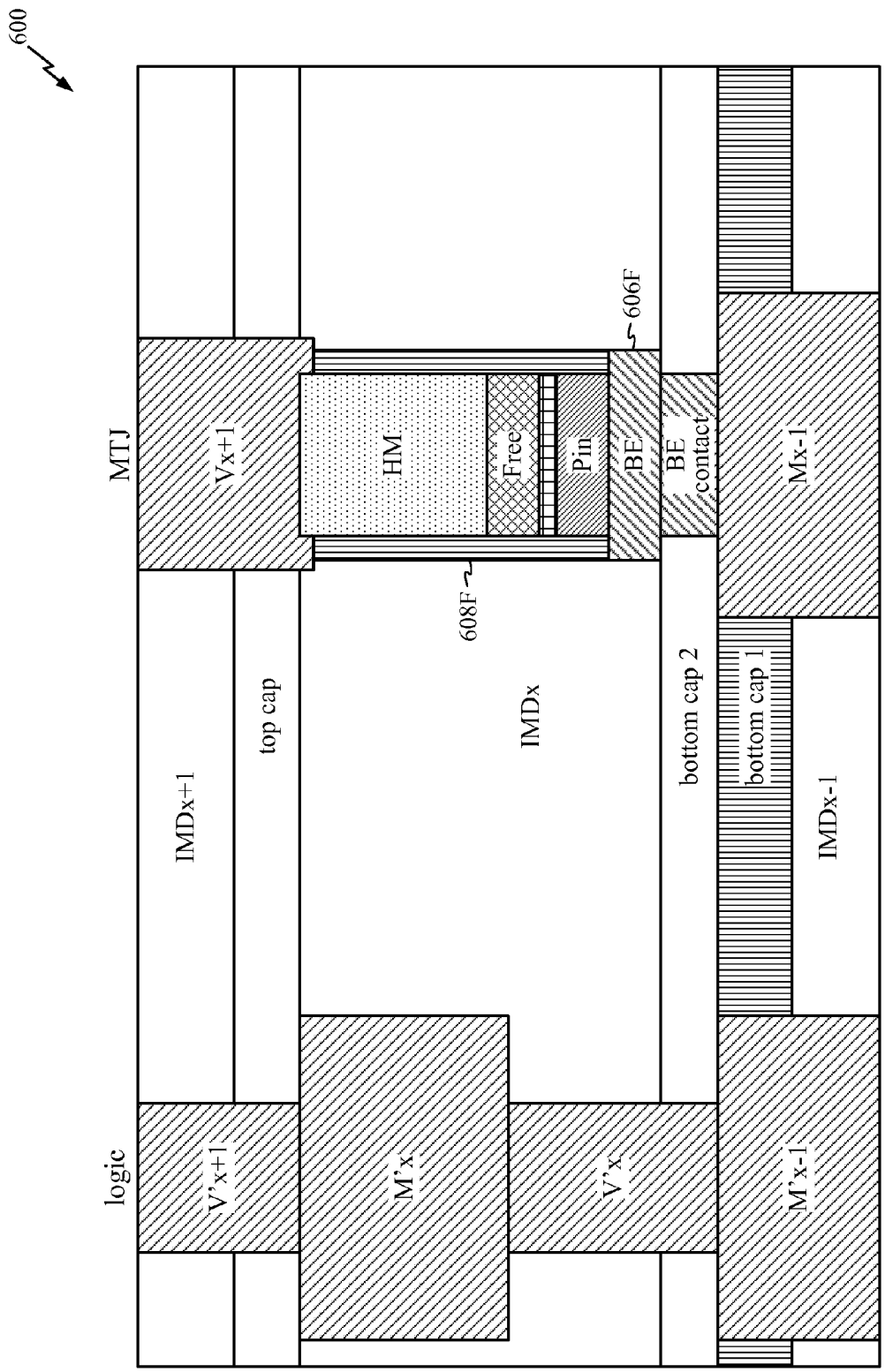
Figure 6G:
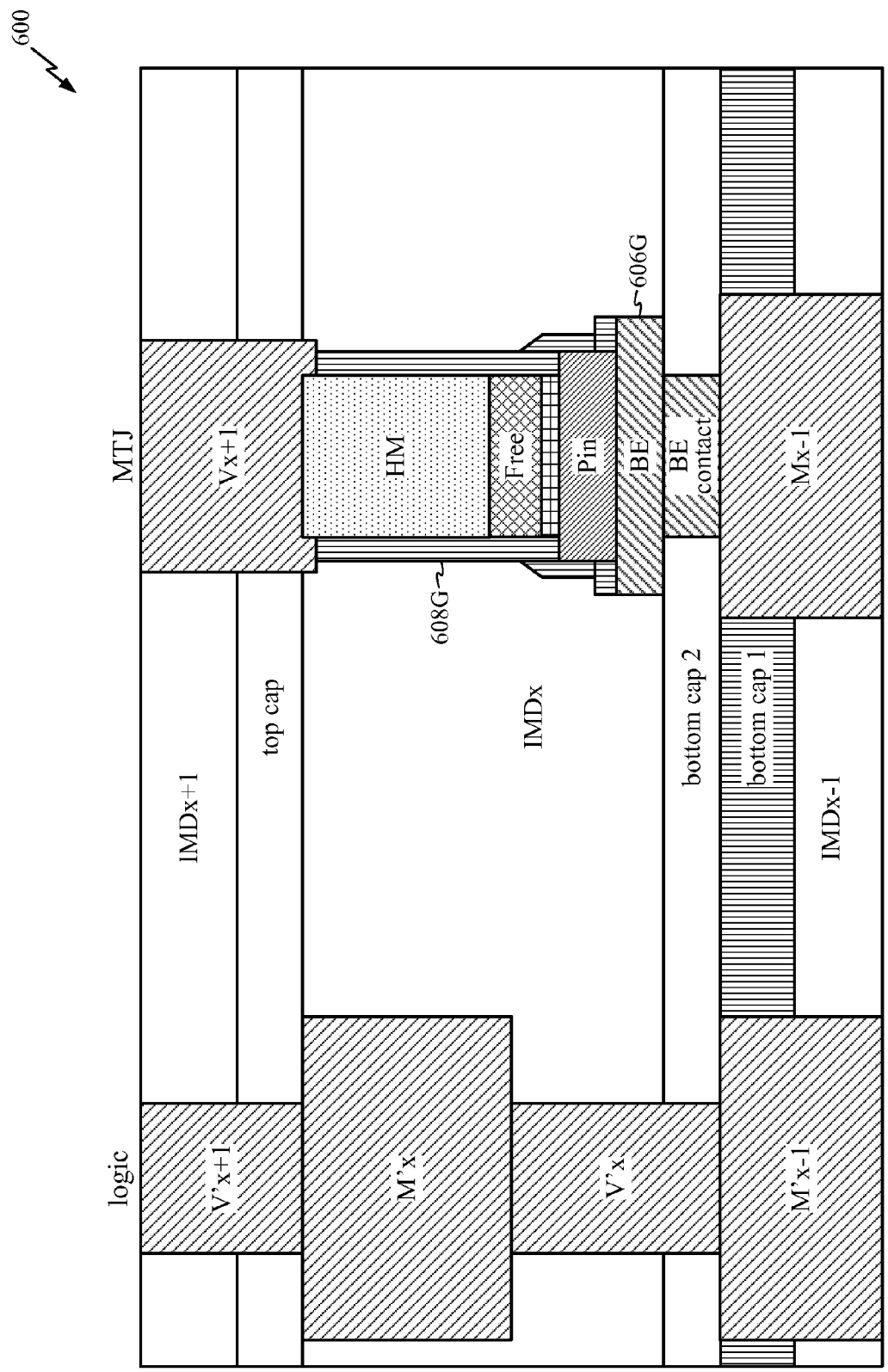
Figure 6H:
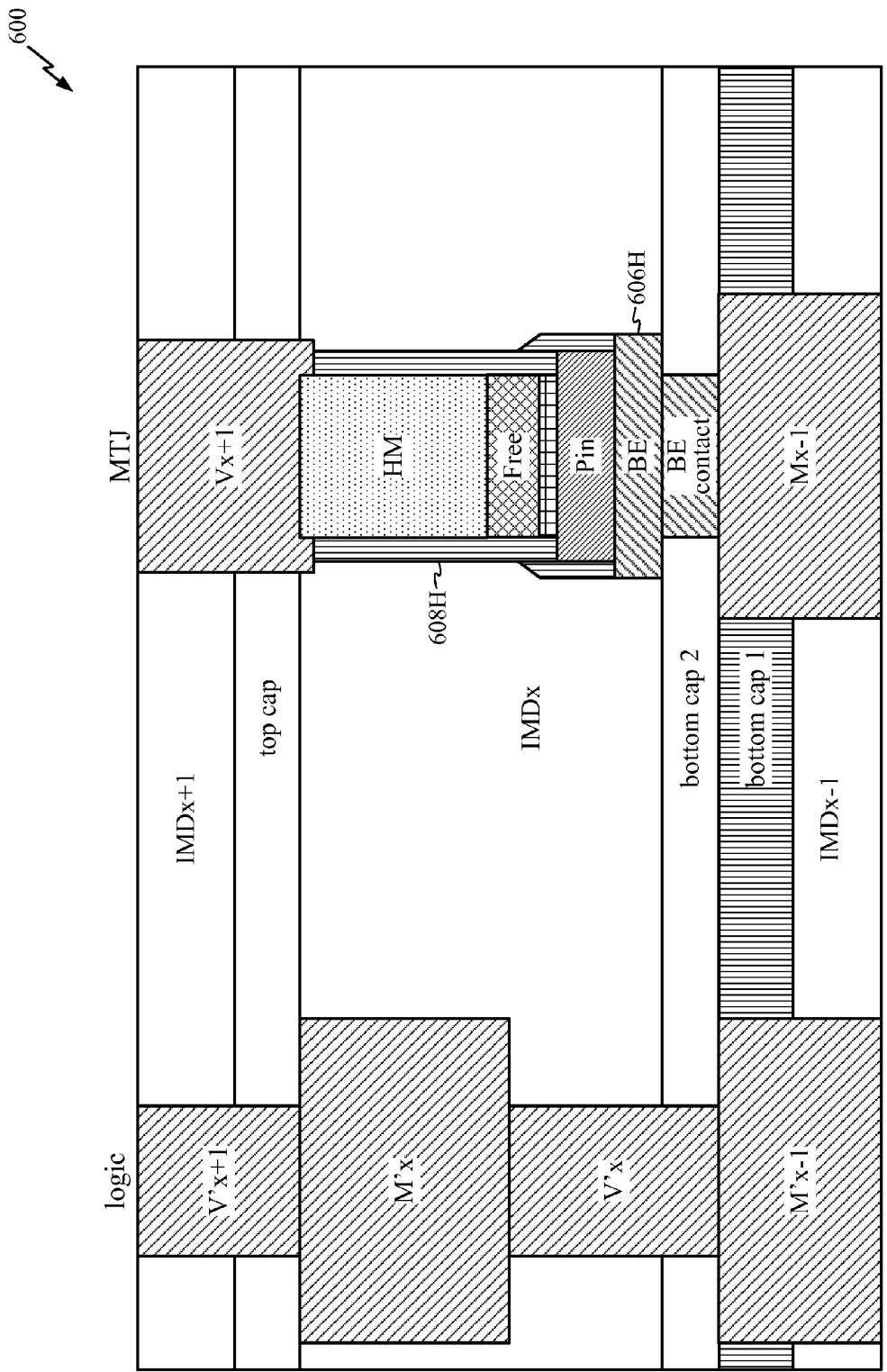
Figure 6I:
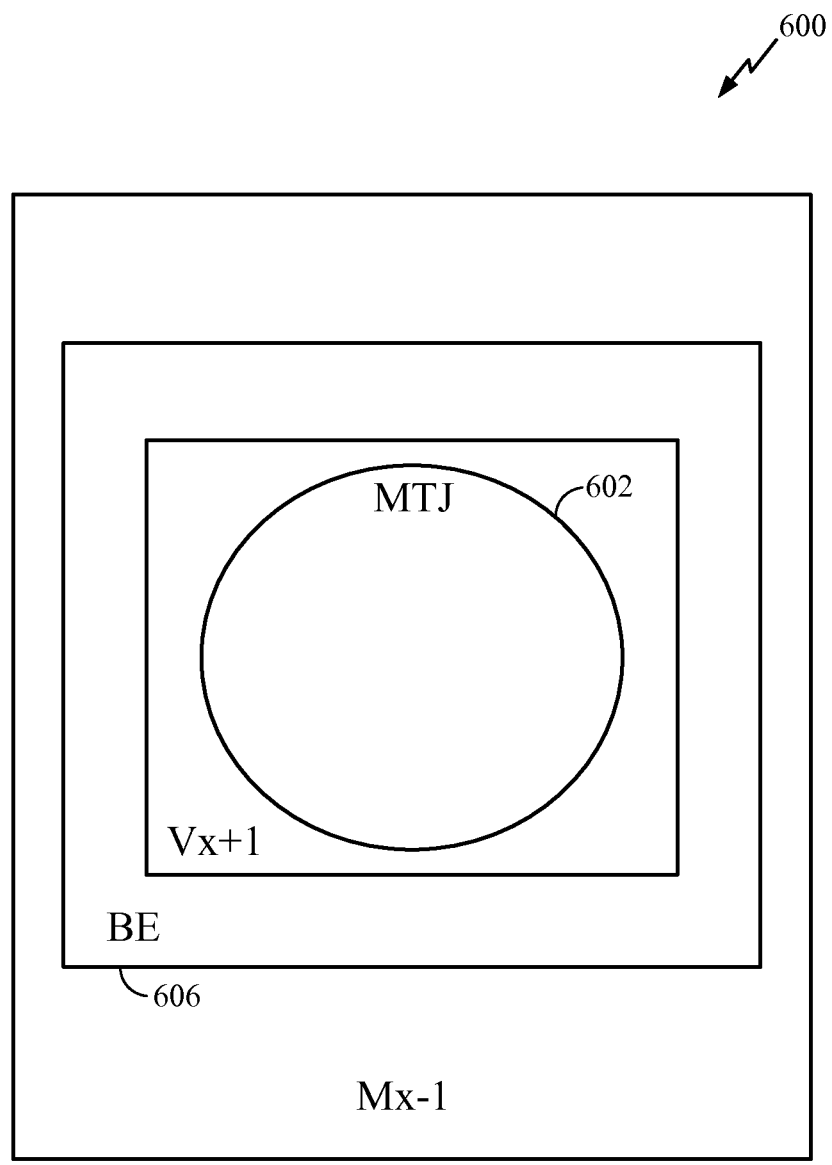
FIG. 6I illustrates a top view of the layout of the MTJ side of memory device 600, which substantially corresponds to most of the variations of memory device 600 seen across FIGS. 6A-H.

Coming now to FIGS. 6E-H, bottom metal lines M'x−1 and Mx−1 are formed to protrude through bottom-cap 1, similar to the embodiments depicted in FIGS. 4G-L. In this manner, on the MTJ side, the width of BE contact 612E can be shrunk, and metal line Mx−1 in the lower layer x−1 can be brought closer to MTJ 602. More specifically in FIG. 6E, BE 606E is connected to metal line Mx−1 through BE contact 612E, where BE contact 612E acts as a via through bottom-cap 2. Since this arrangement can clear up some room in the x layer or create additional separation between bottom and top cap layers, HM 610E may be elongated or formed of additional height to couple MTJ 602 to via Vx+1. Correspondingly, side cap 608E can be enlarged to protect MTJ 602 along with the additional height of HM 610E. In FIG. 6F, the horizontal surface area of BE 606F is reduced and side cap 608F is correspondingly modified to remove its horizontal segments that were formed on BE 606E in FIG. 6E. In FIG. 6G, the pinned layer of MTJ 602 is widened, the horizontal surface area of BE 606G is increased, and side cap 608G is appropriately contoured. Compared to FIG. 6G, the horizontal surface area of BE 606H is reduced and side cap 608H is correspondingly tailored.

Figure 7:
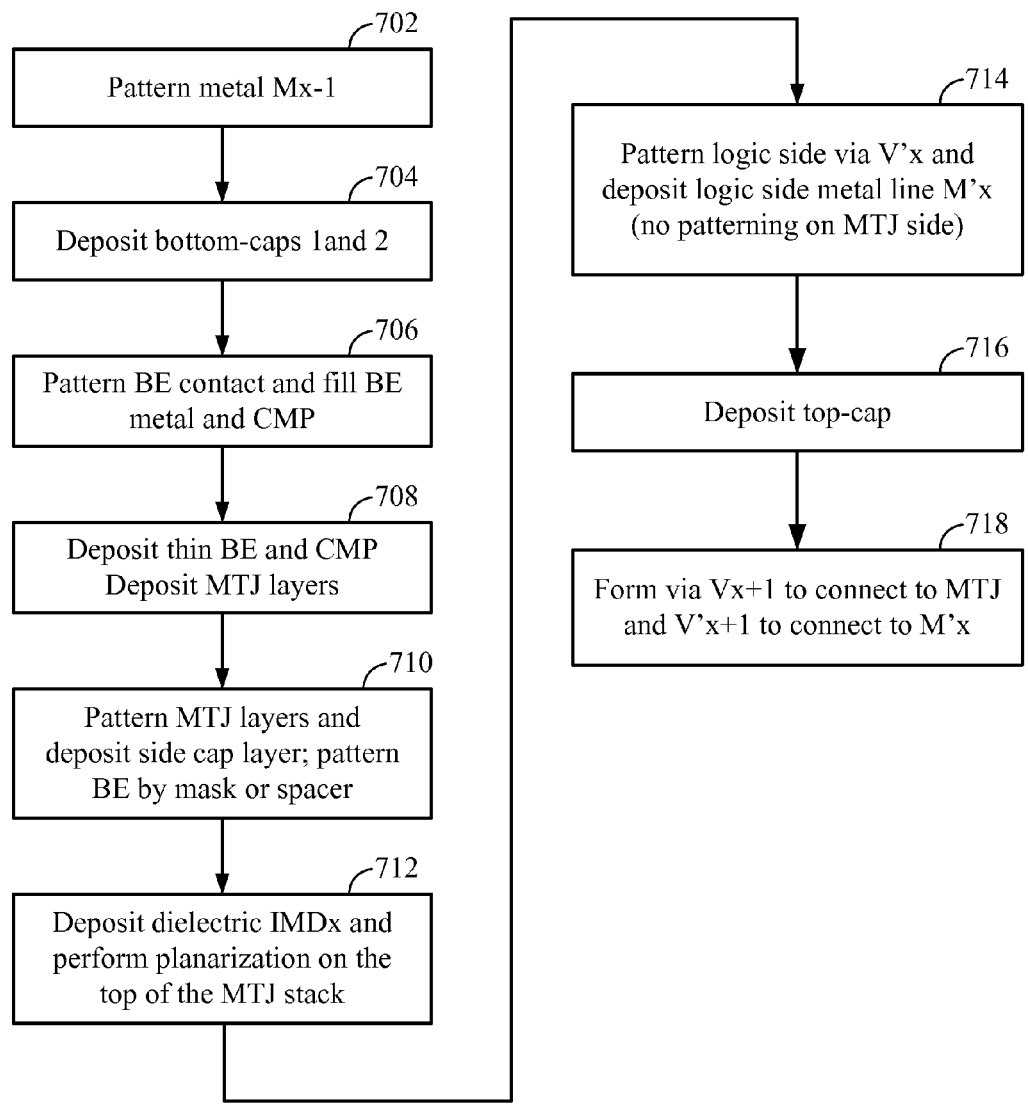
FIG. 7 illustrates a flowchart detailing an exemplary process of forming memory device 600 of FIGS. 6A-H.

With reference now to FIG. 7, a flowchart detailing an exemplary process of forming memory device 600 is illustrated. The flowchart includes the following process: metal line Mx−1 (as well as, metal line M'x−1 for the logic side) in IMDx−1 in layer x−1 is patterned—Block 702; insulating bottom cap layers bottom-caps 1 and 2 in layer x can be deposited next—Block 704; the bottom cap layers are patterned to make room for a BE contact (e.g., BE contact 612), metal for the BE contact is then filled and chemical mechanical polishing (CMP) is performed—Block 706; a thin BE layer or film is then deposited and a short CMP is performed, following which, a BE (e.g., BE 604) and MTJ layers or MTJ stack (e.g., MTJ 602, comprising, for example, a pinned layer, barrier layer, free layer, and HM 610) are deposited on the thin BE layer—Block 708; the MTJ layers are patterned and a side cap layer (e.g., side cap 608) are deposited, and the BE is patterned, using either a mask or a spacer—Block 710; common IMDx is deposited in the regions between the MTJ side and the logic side in layer x, and planarization is performed on top of the MTJ—Block 712; bottom-caps 1 and 2 are patterned and via V'x for the logic side is created through bottom-caps 1 and 2, and metal line M'x for the logic side in layer x can be deposited, while taking care not to pattern on the MTJ side—Block 714; top-cap 1 can be deposited over the hard mask (e.g., HM 610) on the MTJ side, and the metal line M'x on the logic side—Block 716; and top-cap 1 is patterned to form vias, Vx+1 on the MTJ side to connect to the HM and V'x+1 to connect to metal line M'x on the logic side—Block 718.

In contrast to the process described in FIG. 5 for formation of memory device 400 according to FIGS. 4A-L, it is seen that fewer steps are involved in the above-described process of FIG. 7 for formation of memory device 600 according to FIGS. 6A-H. This is because steps related to formation of a TE are not required in the process of FIG. 7. Correspondingly, the number of masks used in the process of FIG. 7 is also lower than those discussed with regard to FIG. 5.

In more detail, for the process of FIG. 7, only two masks may be needed in the case of memory device 600 fabricated according to FIGS. 6A-H, where a first mask is for the BE contact formation discussed in Blocks 706-708 and a second mask for formation of the MTJ stack discussed in Blocks 708-710. It is seen that memory device 600 is also fully compatible with the logic processes (e.g., Blocks 702-704 and 714-718).

Those of skill in the art will appreciate that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Further, those of skill in the art will appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present invention.

The methods, sequences and/or algorithms described in connection with the embodiments disclosed herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor.

Accordingly, an embodiment of the invention can include a computer readable media embodying a method for MRAM integration with logic processes, compatible and robust for future device technologies with shrinking device sizes. Accordingly, the invention is not limited to illustrated examples and any means for performing the functionality described herein are included in embodiments of the invention.

While the foregoing disclosure shows illustrative embodiments of the invention, it should be noted that various changes and modifications could be made herein without departing from the scope of the invention as defined by the appended claims. The functions, steps and/or actions of the method claims in accordance with the embodiments of the invention described herein need not be performed in any particular order. Furthermore, although elements of the invention may be described or claimed in the singular, the plural is contemplated unless limitation to the singular is explicitly stated.

What is claimed is:

1. A magnetoresistive random-access memory (MRAM) comprising:
   a magnetic tunnel junction (MTJ) formed in a common interlayer metal dielectric (IMD) layer with one or more logic elements,
   wherein, the MTJ is connected to a bottom metal line in a bottom IMD layer and a top via connected to a top IMD layer, wherein the MTJ is in direct physical contact with the top via,
   wherein the MTJ extends between one or more bottom cap layers configured to separate the common IMD layer and the bottom IMD layer, and one or more top cap layers configured to separate the common IMD layer and the top IMD layer.

2. The MRAM of claim 1, wherein the MTJ comprises a free layer, a barrier layer, and a pinned layer.

3. The MRAM of claim 1, wherein the MTJ comprises a hard mask connected to a top electrode, such that the MTJ is connected to the top via through the top electrode.

4. The MRAM of claim 3 comprising two bottom cap layers configured to separate the common IMD layer and the bottom IMD layer, and wherein a bottom electrode of the MTJ is connected to the bottom metal line through a bottom electrode contact, wherein the bottom electrode contact extends through both of the two bottom cap layers.

5. The MRAM of claim 4, fabricated with three masks, wherein a first mask is used for formation of the bottom electrode contact, a second mask is used for formation the MTJ, and a third mask is used for formation the top electrode.

6. The MRAM of claim 3 comprising two bottom cap layers configured to separate the common IMD layer and the bottom IMD layer, and wherein a bottom electrode of the MTJ is connected to the bottom metal line through a bottom electrode contact, wherein the bottom electrode contact extends through only one of the two bottom cap layers.

7. The MRAM of claim 1, wherein the MTJ comprises a hard mask such that the MTJ is connected to the top via directly through the hard mask.

8. The MRAM of claim 7, comprising two bottom cap layers configured to separate the common IMD layer and the bottom IMD layer, and wherein a bottom electrode of the MTJ is connected to the bottom metal line through a bottom electrode contact, wherein the bottom electrode contact extends through both of the two bottom cap layers.

9. The MRAM of claim 8, fabricated with two masks, wherein a first mask is used for formation of the bottom electrode contact, and a second mask is used for formation of the MTJ.

10. The MRAM of claim 7, comprising two bottom cap layers configured to separate the common IMD layer and the bottom IMD layer, and wherein a bottom electrode of the MTJ is connected to the bottom metal line through a bottom electrode contact, wherein the bottom electrode contact extends through only one of the two bottom cap layers.

11. The MRAM of claim 1, wherein the one or more logic elements comprise one or more of a via and a metal line formed in the common IMD layer.

12. The MRAM of claim 1, further comprising a protective side cap configured to surround the MTJ.

13. A magnetoresistive random-access memory (MRAM) device comprising:
    a magnetic storage means formed in a common insulating means with one or more means for performing a logic function,
    wherein, the magnetic storage means is connected to a bottom metallic means in a bottom insulating means and a top through interconnection means connected to a top insulating means, wherein the magnetic storage means is in direct physical contact with the top through interconnection means, and
    wherein a magnetic tunnel junction (MTJ) extends between bottom means for separating the common insulating means and the bottom insulating means and one or more top means for separating the common insulating means and the top insulating means.

* * * * *